(12) United States Patent
Takekida

(10) Patent No.: US 10,741,580 B2
(45) Date of Patent: Aug. 11, 2020

(54) SEMICONDUCTOR MEMORY DEVICE

(71) Applicant: TOSHIBA MEMORY CORPORATION, Minato-ku (JP)

(72) Inventor: Hideto Takekida, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/293,969

(22) Filed: Mar. 6, 2019

(65) Prior Publication Data
US 2020/0075626 A1 Mar. 5, 2020

(30) Foreign Application Priority Data

Aug. 30, 2018 (JP) ................ 2018-161023

(51) Int. Cl.
| | |
|---|---|
| *H01L 27/11582* | (2017.01) |
| *H01L 27/11565* | (2017.01) |
| *H01L 27/1157* | (2017.01) |
| *H01L 27/11573* | (2017.01) |
| *H01L 23/522* | (2006.01) |
| *H01L 29/36* | (2006.01) |
| *H01L 21/28* | (2006.01) |
| *H01L 27/11526* | (2017.01) |

(Continued)

(52) U.S. Cl.
CPC .... *H01L 27/11582* (2013.01); *H01L 23/5226* (2013.01); *H01L 27/1157* (2013.01); *H01L 27/11565* (2013.01); *H01L 27/11573* (2013.01); *H01L 29/36* (2013.01); *H01L 29/40117* (2019.08); *H01L 27/11519* (2013.01); *H01L 27/11524* (2013.01); *H01L 27/11526* (2013.01); *H01L 27/11556* (2013.01)

(58) Field of Classification Search
CPC ......... H01L 27/11582; H01L 27/11565; H01L 27/1157
See application file for complete search history.

(56) References Cited

U.S. PATENT DOCUMENTS

| | | | |
|---|---|---|---|
| 8,994,094 B2 * | 3/2015 | Matsuda | H01L 29/40117 257/324 |
| 9,917,094 B2 * | 3/2018 | Lee | H01L 27/11519 |
| 2016/0268304 A1 | 9/2016 | Ikeda et al. | |

FOREIGN PATENT DOCUMENTS

JP 2016-171243 9/2016

* cited by examiner

*Primary Examiner* — Jose R Diaz
(74) *Attorney, Agent, or Firm* — Oblon, McClelland, Maier & Neustadt, L.L.P.

(57) ABSTRACT

A semiconductor memory device comprises: a substrate; a first conductive layer and a second conductive layer arranged in a first direction crossing a surface of the substrate and extending in a second direction crossing the first direction, the first conductive layer being closer to the substrate than the second conductive layer, a length in the second direction of the first conductive layer being greater than the length of the second conductive layer; a first semiconductor film extending in the first direction and facing the first and second conductive layers; a second semiconductor film interposed between ends of the first and second conductive layers, extending in the first direction, and facing the first conductive layer; a first wiring farther from the substrate than the first semiconductor film and being electrically connected to the first semiconductor film; and a second wiring farther from the substrate than the second semiconductor film and being electrically connected to the second semiconductor film.

20 Claims, 35 Drawing Sheets

(51) Int. Cl.
*H01L 27/11556* (2017.01)
*H01L 27/11524* (2017.01)
*H01L 27/11519* (2017.01)

SEMICONDUCTOR MEMORY DEVICE

CROSS-REFERENCE TO RELATED APPLICATIONS

This application is based upon and claims the benefit of Japanese Patent Application No. 2018-161023, filed on Aug. 30, 2018, the entire contents of which are incorporated herein by reference.

BACKGROUND

Field

Embodiments described below relate to a semiconductor memory device.

Description of the Related Art

There has been known a semiconductor memory device comprising: a substrate; a plurality of conductive layers arranged in a first direction crossing a surface of the substrate; and a semiconductor film extending in the first direction and facing the plurality of conductive layers.

DETAILED DESCRIPTION

Figure 1:
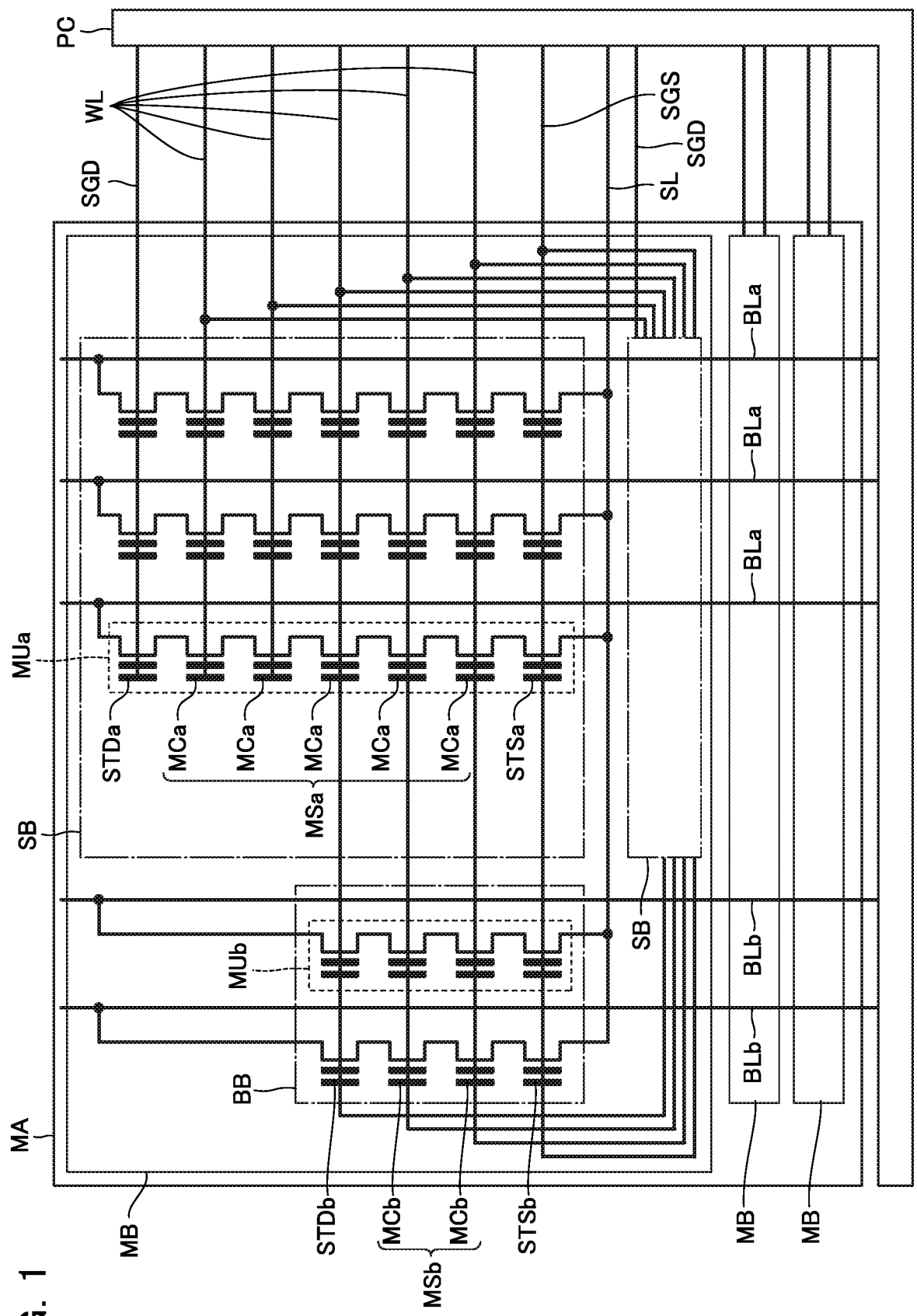
FIG. 1 is an equivalent circuit diagram illustrating a schematic configuration of a semiconductor memory device according to a first embodiment.

A semiconductor memory device according to an embodiment comprises: a substrate; a first conductive layer and a second conductive layer; a first semiconductor film and a second semiconductor film; and a first wiring and a second wiring. The first conductive layer and the second conductive layer are arranged separated in a first direction crossing a surface of the substrate, and extend in a second direction crossing the first direction. In addition, the first conductive layer is closer to the substrate than the second conductive layer, and the length in the second direction of the first conductive layer is greater than the length of the second conductive layer. The first semiconductor film extends in the first direction and faces the first conductive layer and the second conductive layer. The second semiconductor film is interposed between an end of the first conductive layer and an end of the second conductive layer in the second direction, extending in the first direction and facing the first conductive layer. The first wiring is farther from the substrate than the first semiconductor film and is electrically connected to the first semiconductor film. The second wiring is farther from the substrate than the second semiconductor film and is electrically connected to the second semiconductor film.

A semiconductor memory device according to another embodiment comprises: a substrate; a first conductive layer and a second conductive layer; and a first semiconductor film and a second semiconductor film. The first conductive layer and the second conductive layer are arranged separated in a first direction crossing a surface of the substrate, and extend in a second direction crossing the first direction. In addition, the first conductive layer is closer to the substrate than the second conductive layer, and the length in the second direction of the first conductive layer is greater than the length of the second conductive layer. The first semiconductor film extends in the first direction and faces the first conductive layer and the second conductive layer. The second semiconductor film is interposed between an end of the first conductive layer and an end of the second conductive layer in the second direction, extending in the first direction and facing the first conductive layer. In addition, in the second direction, the thickness of the second semiconductor film is greater than the thickness of the first semiconductor film.

A semiconductor memory device according to still another embodiment comprises: a substrate; a first conductive layer and a second conductive layer; and a first semiconductor film and a second semiconductor film. The first conductive layer and the second conductive layer are arranged separated in a first direction crossing a surface of the substrate, and extend in a second direction crossing the first direction. In addition, the first conductive layer is closer to the substrate than the second conductive layer. The first semiconductor film extends in the first direction and faces the first conductive layer. The second semiconductor film is interposed between the first conductive layer and the first semiconductor film. In addition, the second semiconductor film contains an impurity, and a concentration of the impurity in the second semiconductor film is higher than the concentration of the impurity in the first semiconductor film.

Then, the semiconductor memory device according to the embodiments will be described in detail with reference to the drawings. It should be noted that the following embodiments are merely examples and are not intended to limit the present invention.

Further, in this specification, a direction crossing a surface of the substrate is referred to as a first direction; a direction crossing the first direction is referred to as a second direction; and a direction crossing the first direction and the second direction is referred to as a third direction. A predetermined direction parallel to the surface of the substrate is referred to as an X direction; a direction parallel to the surface of the substrate and perpendicular to the X direction is referred to as a Y direction; and a direction perpendicular to the surface of the substrate is referred to a Z direction. The following description will exemplify a case in which the X direction, the Y direction, and the Z direction correspond to the third direction, the second direction, and the first direction respectively. Note that the first direction, the second direction, and third direction are not limited to the Z direction, the Y direction, and the X direction.

Also, in this specification, expressions such as "up" and "down" are based on the position relative to the substrate. For example, a direction away from the substrate along the first direction is referred to as an upward direction, and a direction close to the substrate along the first direction is referred to as a downward direction. In addition, when a certain component is referred to as a lower surface or a lower end, it means a surface or an end portion of this component on the substrate side respectively. When a certain component is referred to as an upper surface or an upper end, it means a surface or an end of this component on an opposite side of the substrate. Further, a surface crossing the second direction or the third direction is referred to as a side surface or the like.

Also, in this specification, when it is described that a first component is "electrically connected to" a second component, it may mean that the first component is directly connected to the second component or the first component is connected to the second component with a wiring, a semiconductor member, a transistor, or the like interposed therebetween. For example, when three transistors are connected in series, even if the second transistor is in the OFF state, it is described that the first transistor is "electrically connected" to the third transistor.

Also, in this specification, when it is described that the first component is "electrically isolated" from the second component, it may mean that for example, an insulating film or the like is interposed between the first component and the second component, and there is not a contact, a wiring, or the like connecting between the first component and the second component.

Also, in this specification, when "radial direction" is described in association with a columnar, cylindrical, or annular member or a through-hole, and the like, the radial direction may mean a direction close to or away from a central axis of the cylinder or the like in a plane perpendicular to the central axis. Also, when a "thickness in radial direction" or the like is described in association with a cylindrical or annular member, and the like, the thickness may mean a difference between a distance from the center axis to an inner peripheral surface and a distance from the central axis to an outer peripheral surface in such a plane. Also, when a "thickness in radial direction" or the like is described in association with a columnar member and the like, the thickness may mean the distance from the central axis to the outer peripheral surface in such a plane.

Also, in this specification, a "width", a "length", and a "thickness" in a predetermined direction are described in association with a component, a member, and the like, they may mean a width, a length, and a thickness respectively in a cross section observed by a scanning electron microscopy (SEM), a transmission electron microscopy (TEM), or the like.

[First Embodiment]

[Configuration]

Hereinafter, the configuration of a semiconductor memory device according to a first embodiment will be described with reference to the drawings. It should be noted that the following drawings are schematic, and for the convenience of description, a part of the configuration may be omitted.

FIG. 1 is a schematic equivalent circuit diagram illustrating a configuration of the semiconductor memory device according to the first embodiment.

The semiconductor memory device according to the present embodiment includes a memory cell array MA, and a peripheral circuit PC which controls the memory cell array MA.

The memory cell array MA includes a plurality of memory blocks MB. Each of the plurality of memory blocks MB includes a plurality of sub-blocks SB and buffer blocks BB.

Each of the sub-blocks SB includes a plurality of memory units MUa. An end of each of the plurality of memory units MUa is connected to the peripheral circuit PC via a bit line BLa. The other end of each of the plurality of memory units MUa is connected to the peripheral circuit PC via a common source line SL.

The memory unit MUa includes a drain select transistor STDa, a memory string MSa, and a source select transistor STSa connected in series between the bit line BLa and the source line SL.

The memory string MSa includes a plurality of memory cells MCa connected in series. The memory cell MCa is a field-effect transistor including a semiconductor film, a gate insulating film, and a gate electrode. The semiconductor film functions as a channel region. The gate insulating film includes a data-storable memory portion. The memory portion is a charge storage film of a silicon nitride film (SiN), a floating gate, and the like. In this case, the threshold voltage of the memory cell MCa varies according to the charge amount in the charge storage film. The gate electrode is connected to a word line WL. The word line WL is provided corresponding to the plurality of memory cells MCa belonging to one memory string MSa, and is commonly connected to all memory strings MSa in one memory block MB.

The drain select transistor STDa and the source select transistor STSa are field-effect transistors each including a semiconductor film, a gate insulating film, and a gate electrode. The semiconductor film functions as a channel region. The gate electrode of the drain select transistor STDa is connected to a drain select line SGD. The drain select line SGD is provided corresponding to the sub-block SB, and is commonly connected to all drain select transistors STDa in one sub-block SB. The gate electrode of the source select transistor STSa is connected to a source select line SGS. The source select line SGS is commonly connected to all source select transistors STSa in one memory block MB.

Each of the buffer blocks BB includes a plurality of memory units MUb. An end of each of the plurality of memory units MUb is connected to the peripheral circuit PC via the bit line BLb. The other end of each of the plurality of memory units MUb is connected to the peripheral circuit PC via the common source line SL.

The memory unit MUb includes a drain select transistor STDb, a memory string MSb, and a source select transistor STSb connected in series between the bit line BLb and the source line SL.

The memory string MSb includes a plurality of memory cells MCb connected in series. The number of memory cells MCb included in the memory string MSb is less than the number of memory cells MCa included in the memory string MSa. Like the memory cell MCa, the memory cell MCb is a field-effect transistor including a semiconductor film, a gate insulating film, and a gate electrode. Further, the gate electrode of the memory cell MCb is connected to the word line WL. Among the plurality of word lines WL, some word lines WL are connected to the memory cells MCb, and the remaining word lines WL are electrically isolated from the memory cells MCb.

The drain select transistor STDb has the same structure as the memory cell MCb. The source select transistor STSb has the same structure as the source select transistor STSa.

The peripheral circuit PC generates a voltage required for, for example, reading operation, writing operation, and erasing operation, and applies the voltage to the bit lines BLa and BLb, the source line SL, the word lines WL, and select gate lines (SGD and SGS). The peripheral circuit PC includes a plurality of transistors and wirings provided, for example, on the same chip as the memory cell array MA.

Figure 2:
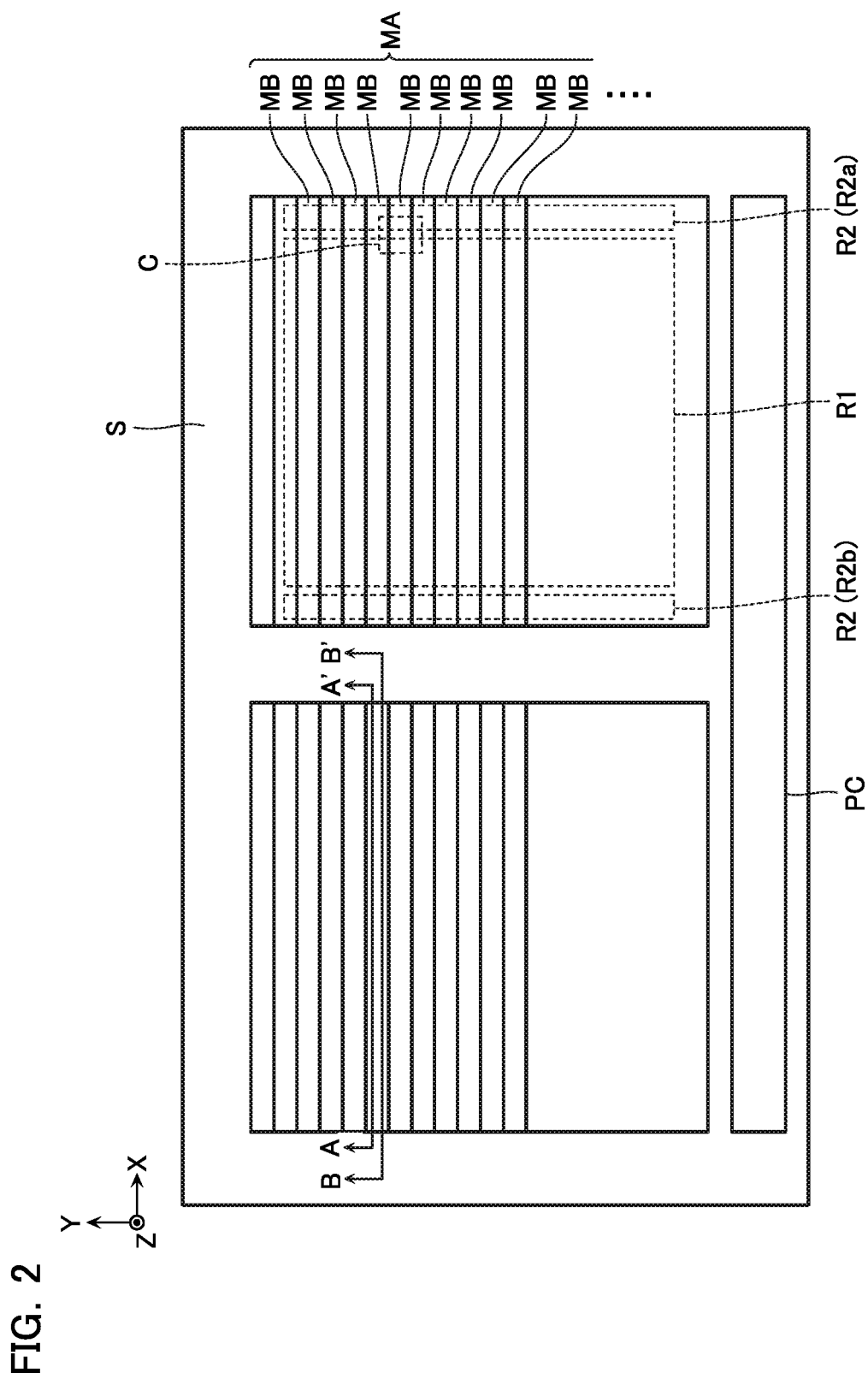
FIG. 2 is a schematic plan view of the semiconductor memory device.
Figure 3A:
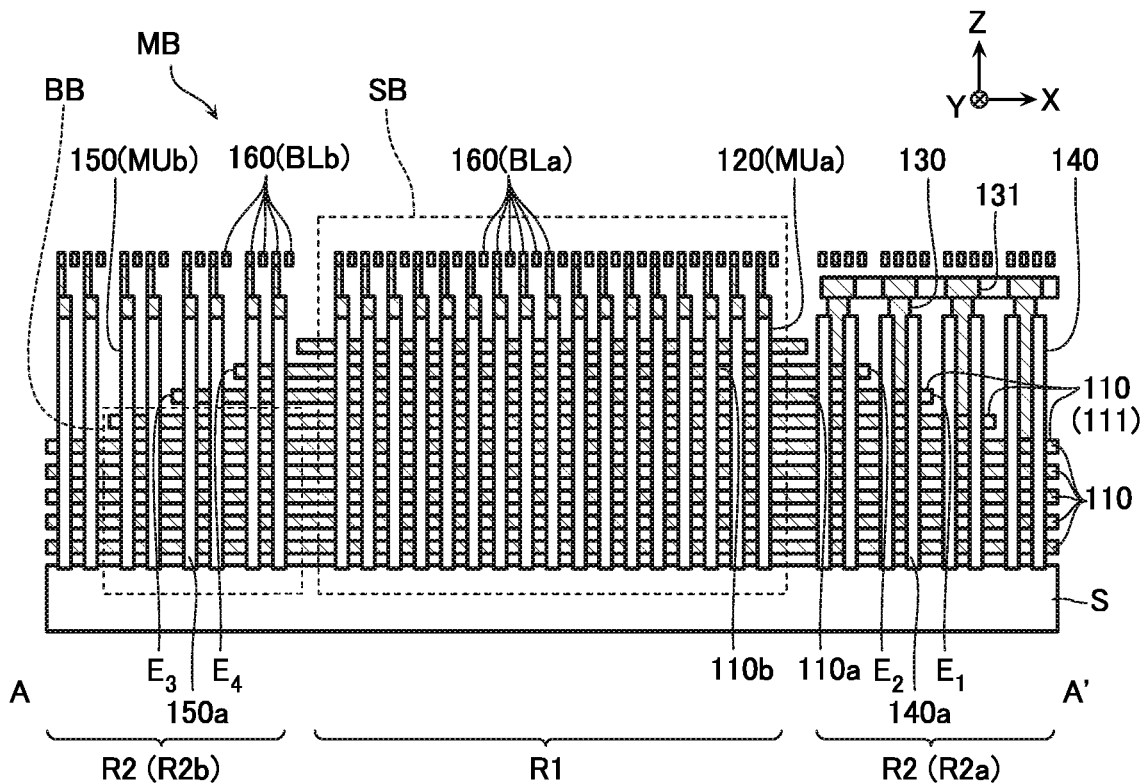
FIG. 3A is a schematic cross-sectional view taken along A-A' line of the structure in FIG. 2 and seen in the direction of the arrow.
Figure 3B:
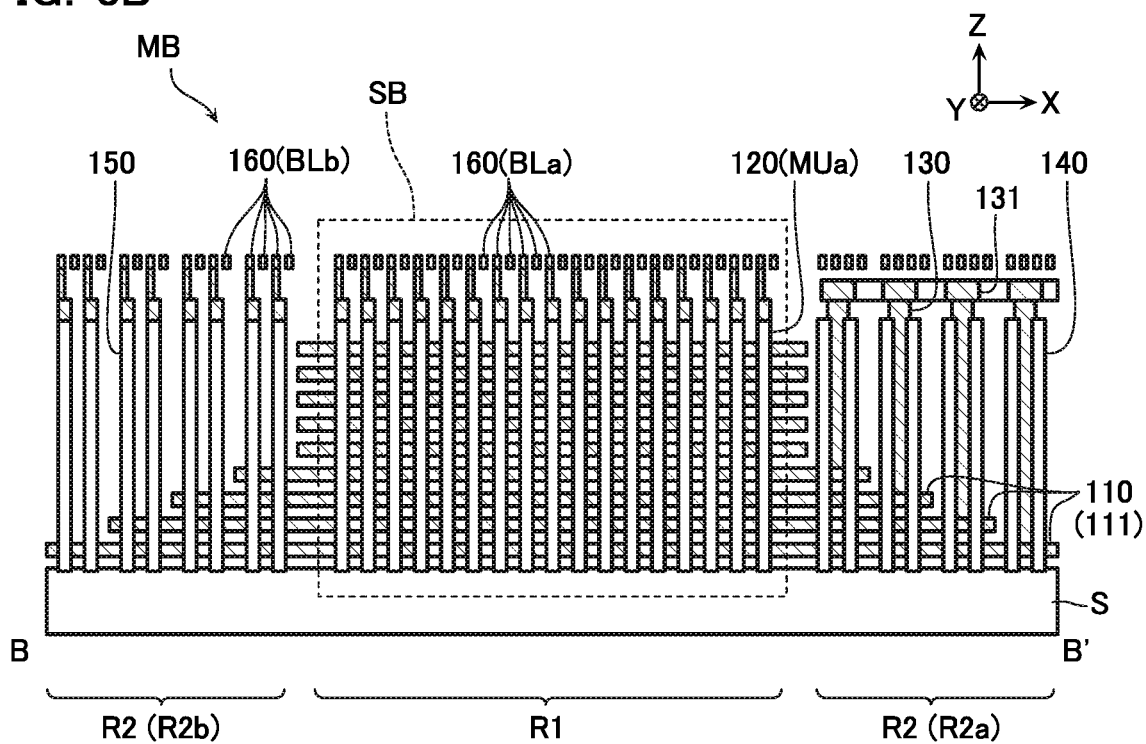
FIG. 3B is a schematic cross-sectional view taken along B-B' line of the structure in FIG. 2 and seen in the direction of the arrow.
Figure 4:
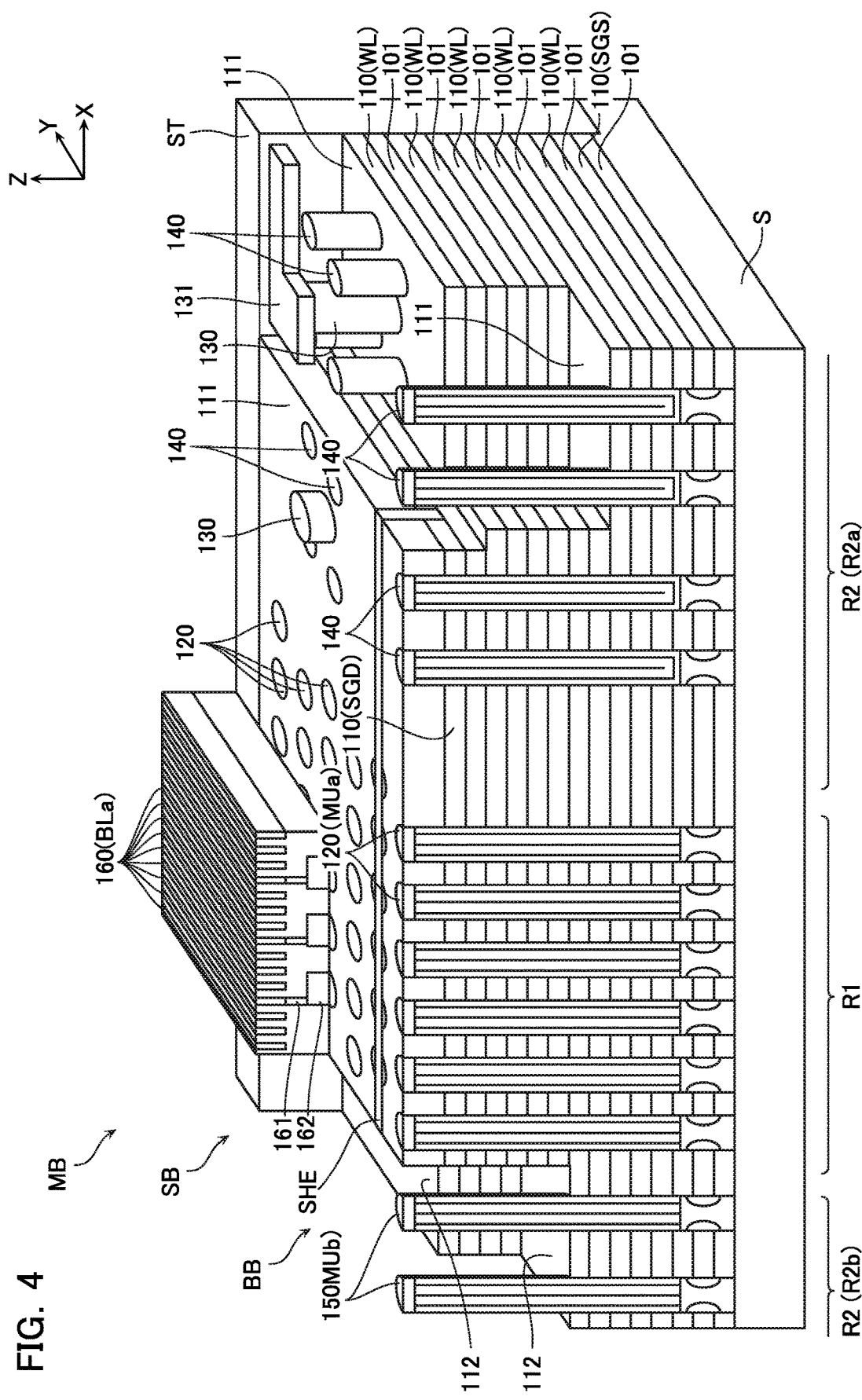
FIG. 4 is a schematic perspective view of the semiconductor memory device.

Then, with reference to FIGS. 2 to 4, a configuration example of the semiconductor memory device according to the present embodiment will be described. FIG. 2 is a schematic plan view of the semiconductor memory device according to the present embodiment. FIG. 3A is a schematic cross-sectional view taken along A-A' line of the structure in FIG. 2 and seen in the direction of the arrow. FIG. 3B is a schematic cross-sectional view taken along B-B' line of the structure in FIG. 2 and seen in the direction of the arrow. FIG. 4 is a schematic perspective view of the semiconductor memory device according to the present embodiment.

As illustrated in FIG. 2, the semiconductor memory device according to the present embodiment includes a substrate S, the memory cell arrays MA provided on the substrate S, and the peripheral circuit PC. In the illustrated example, two memory cell arrays MA are arranged in the X direction on the substrate S. The memory cell array MA includes a plurality of memory blocks MB arranged in the Y direction. Further, as illustrated in the drawing, the memory cell array MA includes a region R1 provided in a central portion of the memory cell array MA; and a region R2 (R2a and R2b) provided on both end portions in the X direction of the memory cell array MA. The region R1 includes the sub-block SB (FIG. 1). The region R2 includes the buffer block BB (FIG. 1) and the like.

As illustrated in FIG. 3A, the memory block MB includes a plurality of conductive layers 110 arranged in the Z direction; a plurality of memory structures 120 provided in the region R1; a plurality of contacts 130 and a plurality of structures 140 provided in the region R2a; a plurality of structures 150 provided in the region R2b; and a plurality of wirings 160 provided above these structures.

As illustrated in FIG. 4, the conductive layers 110 are substantially plate-like conductive layers arranged in the Z direction via an insulating layer 101 of silicon oxide ($SiO_2$) and the like and extending in the X direction. The conductive layer 110 includes a laminated film of, for example, titanium nitride (TiN), tungsten (W), and the like.

The conductive layer 110 located in the lowest layer of the conductive layers 110 functions as the source select line SGS (FIG. 1) and gate electrodes of the plurality of source select transistors STSa and STSb, and the like connected to the source select line SGS. Further, the conductive layers 110 located above the conductive layer 110 located in the lowest layer function as the word lines WL (FIG. 1) and gate electrodes of the plurality of memory cells MCa (FIG. 1) connected to the word lines WL. Furthermore, the conductive layers 110 located above the layers functioning as the word lines WL function as the drain select line SGD and gate electrodes of the plurality of drain select transistors STDa (FIG. 1) connected to the drain select line SGD. The plurality of conductive layers 110 functioning as the drain select line SGD and the like are arranged in the Y direction with an insulating portion SHE therebetween and have a width in the Y direction less than the width of the other conductive layers 110. Note that some conductive layers 110 also function as gate electrodes of the memory cells MCb (FIG. 1) or the drain select transistor STDb (FIG. 1).

Also, a contact portion 111 connected to the contact 130 is provided in an end portion in the X direction of the conductive layer 110. For example, in the cross section illustrated in FIG. 3A, the lengths in the X direction of conductive layers 110 located in layers on the upper side are different from each other, and on the upper side, the lower layer the conductive layer 110 is positioned at, the longer the length in the X direction of the conductive layer 110 is. Each end portion in the X direction of these conductive layers 110 serves as the contact portion 111. Likewise, in the cross section illustrated in FIG. 3B, the lengths in the X direction of conductive layers 110 located in layers on the lower side are different from each other, and on the lower side, the lower layer the conductive layer 110 is positioned at, the longer the length in the X direction of the conductive layer 110 is. Each end portion in the X direction of these conductive layers 110 serves as the contact portion 111.

Each of the memory structures 120 functions as the memory unit MUa. As illustrated in FIG. 4, the memory structures 120 have a substantially cylindrical structure arranged in the X direction and the Y direction and extending in the Z direction. Each of the outer peripheral surfaces of the memory structures 120 is covered with the plurality of conductive layers 110. Further, each lower end of the memory structures 120 is connected to the substrate S. Note that the present embodiment illustrates an example using the surface of the substrate S as the source line SL (FIG. 1). Alternatively, a wiring functioning as the source line SL may be separately provided on the substrate S. Such a wiring is provided, for example, below the plurality of conductive layers 110 and extends in the X direction and the Y direction.

The contacts 130 connect the plurality of conductive layers 110 to the peripheral circuit PC. As illustrated in FIGS. 3A and 3B, the contacts 130 are arranged in the X direction and the Y direction and extend in the Z direction. Each lower end of the contacts 130 is connected to the contact portion 111 of the conductive layer 110. Each upper end of the contacts 130 is connected to a wiring 131 extending in the X direction. The contact 130 and the wiring 131 include a laminated film of, for example, titanium nitride (TiN), tungsten (W), and the like.

In a manufacturing step of the semiconductor memory device, the structures 140 suppress collapse of a pattern in the region R2a. As illustrated in FIG. 4, the structures 140 have a substantially cylindrical structure arranged in the X direction and the Y direction and extending in the Z direction. Each outer peripheral surface of the structures 140 is covered with the plurality of conductive layers 110. Further, each lower end of the structures 140 is connected to the substrate S. Note that for example, in FIG. 3A, when paying attention to conductive layers 110a and 110b arranged separated in the Z direction as well as a structure 140a, the structure 140a is interposed in the X direction between an end $E_1$ in the X direction of the conductive layer 110a and an end $E_2$ in the X direction of the conductive layer 110b located above the conductive layer 110a.

In the manufacturing step of the semiconductor memory device, the structures 150 suppress collapse of a pattern in the region R2b. Note that each of some structures 150 functions as the memory unit MUb. The structures 150 have a substantially cylindrical structure arranged in the X direction and the Y direction and extending in the Z direction. Each outer peripheral surface of the structures 150 is covered with the plurality of conductive layers 110. Further, each lower end of the structures 150 is connected to the substrate S. Note that for example, in FIG. 3A, when paying attention to conductive layers the 110a and 110b as well as a structure 150a, the structure 150a is interposed in the X direction between the other end $E_3$ in the X direction of the conductive layer 110a and the other end $E_4$ in the X direction of the conductive layer 110b located above the conductive layer 110a.

The wirings 160 function as bit lines BLa and BLb. The plurality of wirings 160 are arranged in the X direction across the regions R1 and R2 and extend in the Y direction as illustrated in FIG. 4. The wirings 160 are electrically connected to the plurality of memory structures 120 and some structures 150 with a contact 161 and a contact 162 therebetween. The contact 161 is connected to an upper end of the contact 162 and a lower end of the wiring 160. The width in the X direction of the contact 161 is less than the width in the X direction of the contact 162 and substantially equal to the width of the wiring 160. Note that in the illustrated example, the wirings 160 are located above the wirings 131.

Figure 5:
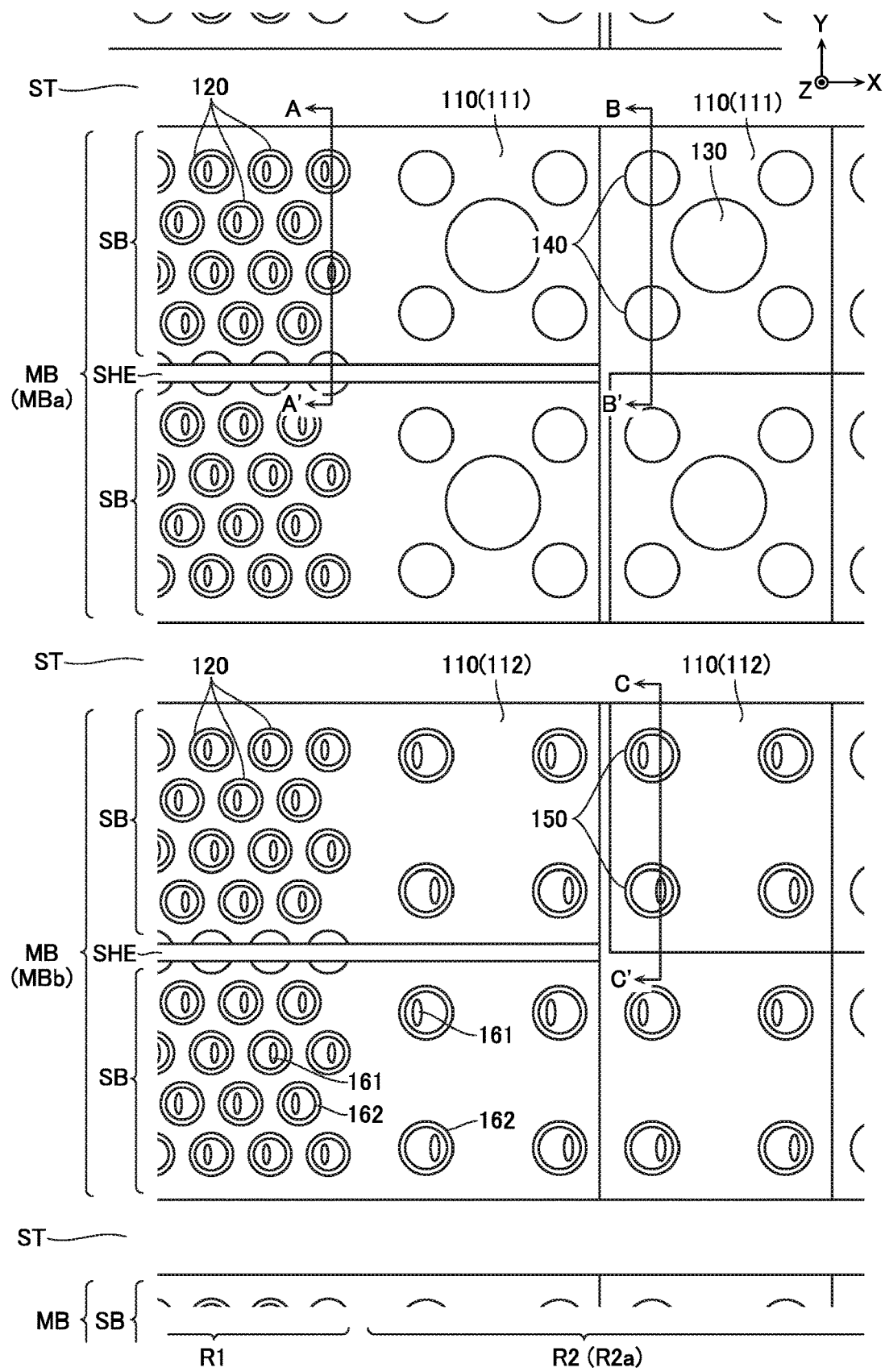
FIG. 5 is an enlarged schematic view of a portion illustrated by C in FIG. 2.
Figure 6:
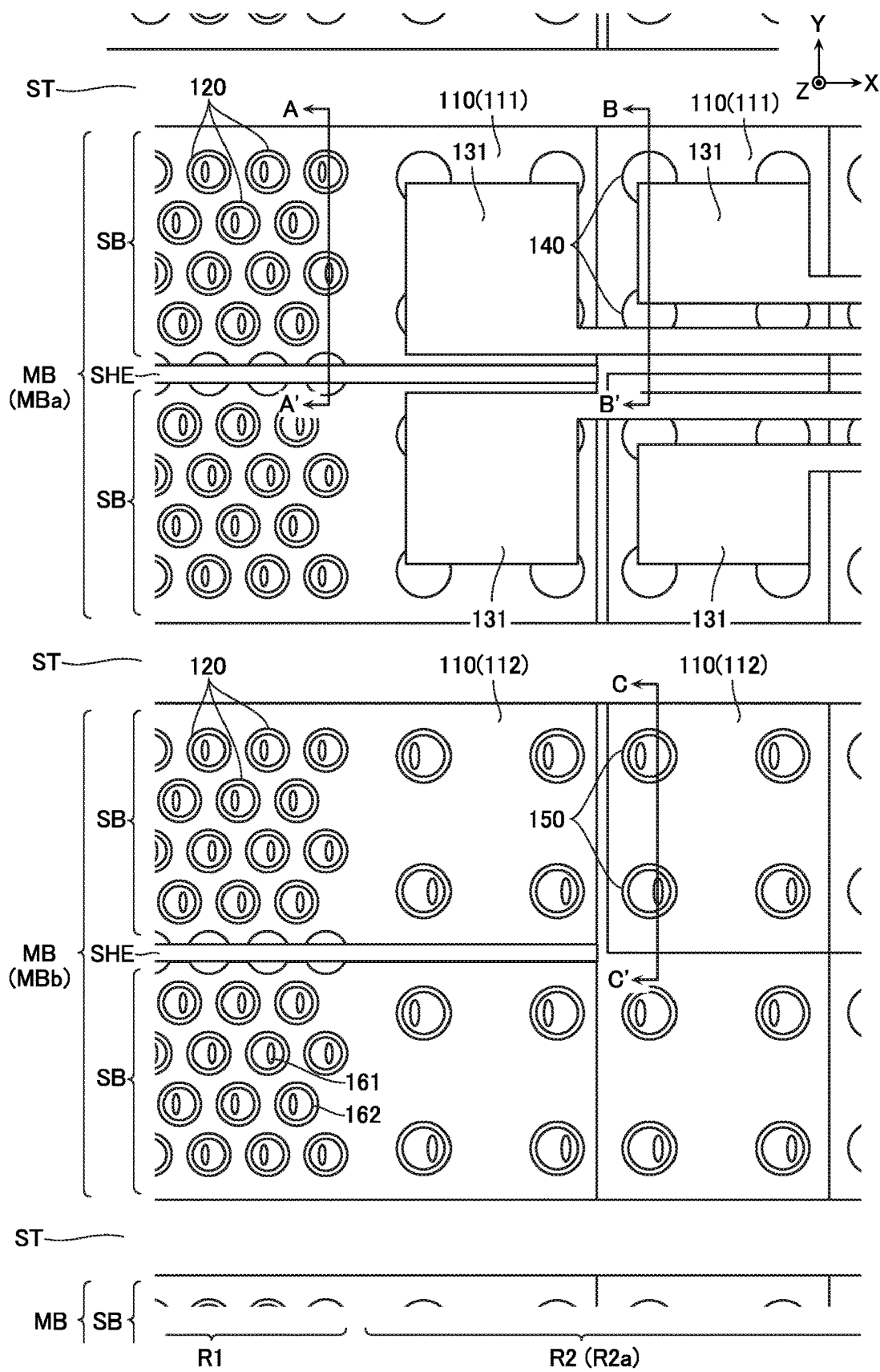
FIG. 6 is a schematic plan view corresponding to FIG. 5.
Figure 7:
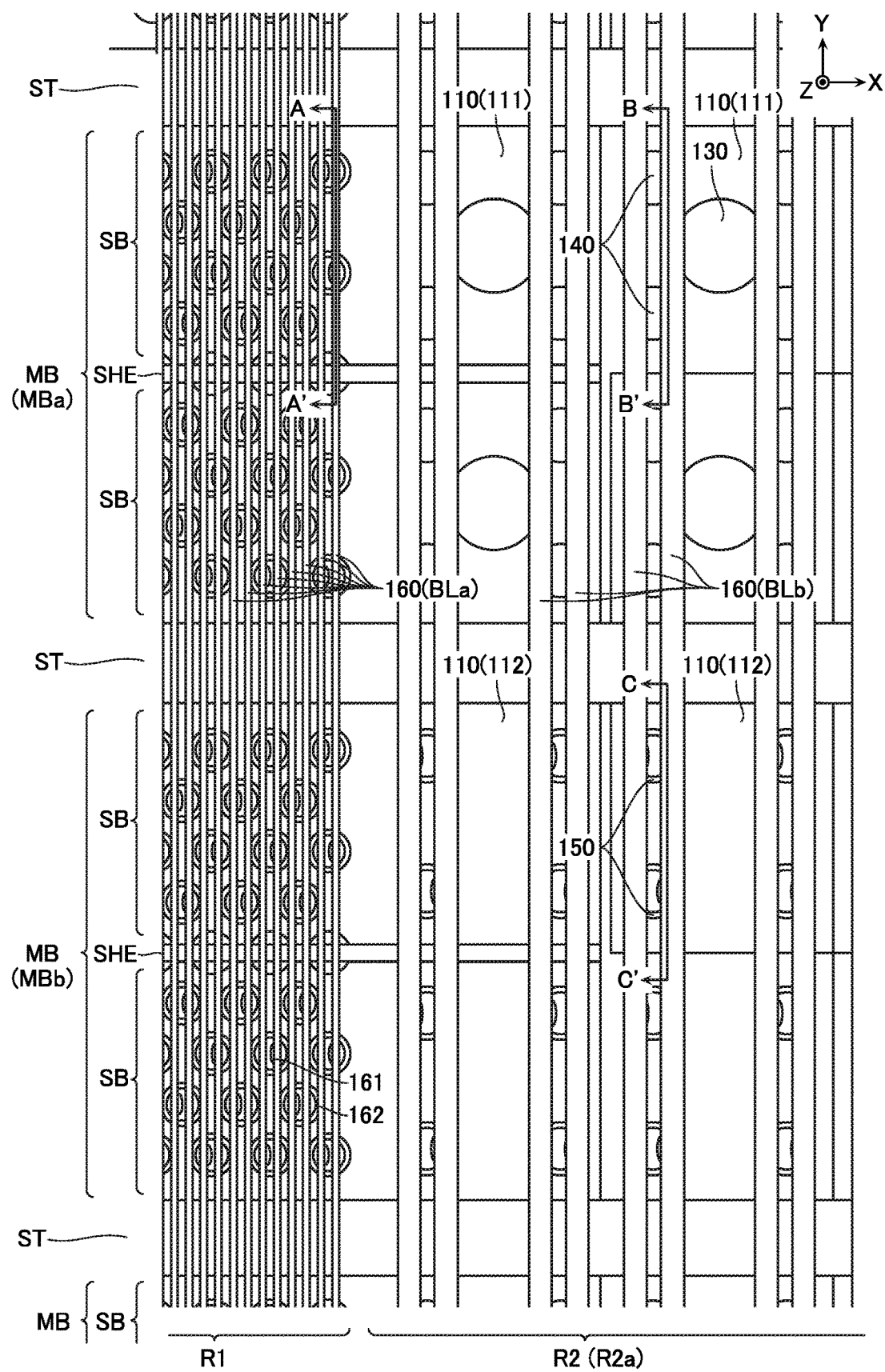
FIG. 7 is a schematic plan view corresponding to FIG. 5.

Then, with reference to FIGS. 5 to 7, an arrangement example of each of the above-described components will be described. FIG. 5 is an enlarged view of a portion illustrated by C in FIG. 2 and illustrates a part of the regions R1 and R2. FIG. 6 is a view corresponding to FIG. 5 and illustrates the wirings 131 described with reference to FIG. 3A and the like. FIG. 7 is a view corresponding to FIG. 5 and illustrates the wirings 160 and the like described with reference to FIG. 3A and the like.

As illustrated in FIG. 5, a plurality of memory blocks MB are arranged in the Y direction with an insulating portion ST therebetween.

In the region R1, each memory block MB includes two sub-blocks SB adjacent to each other in the Y direction with an insulating portion SHE therebetween. Each sub-block SB includes a plurality of memory structures 120 arranged in a staggered manner. In the example illustrated in the drawing, each sub-block SB includes four memory structures 120, each having a different position in the Y direction. Every contact 161 connected to each memory structure 120 has a different position in the X direction. Therefore, each of the four memory structures 120 is connected to a different wiring 160 (see FIG. 7).

As illustrated in FIG. 5, the region R2a includes end portions in the X direction of the plurality of memory blocks MB. Here, attention is paid to two memory blocks MBa and MBb arranged in the Y direction.

The region R2a includes end portions (contact portions 111) in the X direction of the plurality of conductive layers 110 included in the memory block MBa. In the example illustrated in the drawing, two contact portions 111 are provided in the Y direction, and a plurality of contact portions 111 are provided in the X direction. Each contact portion 111 includes a contact 130 and a plurality of structures 140 arranged so as to surround this contact 130. Each of the plurality of contacts 130 is connected to a different wiring 131 (see FIG. 6).

Also, the region R2a includes other end portions 112 in the X direction of the plurality of conductive layers 110 included in the memory block MBb. In the example illustrated in the drawing, two other end portions 112 are provided in the Y direction, and a plurality of other end portions 112 are provided in the X direction. Each of the plurality of other end portions 112 includes a plurality of structures 150. The arrangement of the structures 150 in the other end portions 112 may be the same as or different from that of the structures 140 in the contact portions 111. Each of the structures 150 is connected to the wiring 160 via the contact 161 (see FIG. 7). Note that in the example in FIG. 7, a respective width and an interval in the X direction of the wirings 160 functioning as the bit lines BLb are less than a respective width and an interval in the X direction of the wirings 160 functioning as the bit lines BLa respectively. However, the respective width and the interval in the X direction of the wirings 160 functioning as the bit lines BLb may be substantially equal to the respective width and the interval in the X direction of the wirings 160 functioning as the bit lines BLa respectively.

Note that although not illustrated, the region R2b (FIG. 2) includes other end portions 112 in the X direction of the plurality of conductive layers 110 included in the memory block MBa and end portions (contact portions 111) in the X direction of the plurality of conductive layers 110 included in the memory block MBb. The structure of the memory block MB in the region R2b is substantially equal to the structure of the memory block MB in the region R2a.

Figure 8:
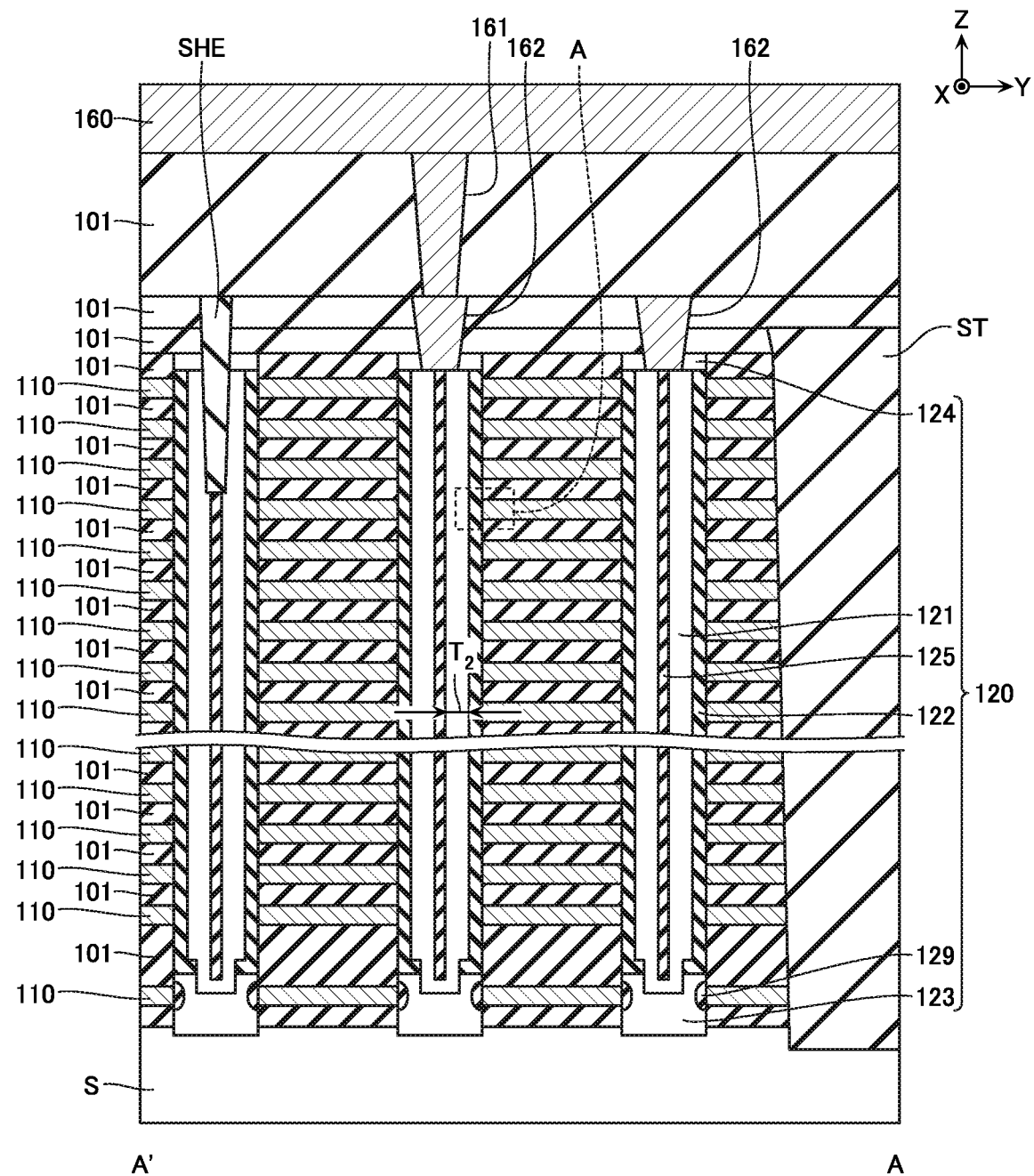
FIG. 8 is a schematic cross-sectional view taken along A-A' line of the structure in FIG. 5 and seen in the direction of the arrow.
Figure 9:
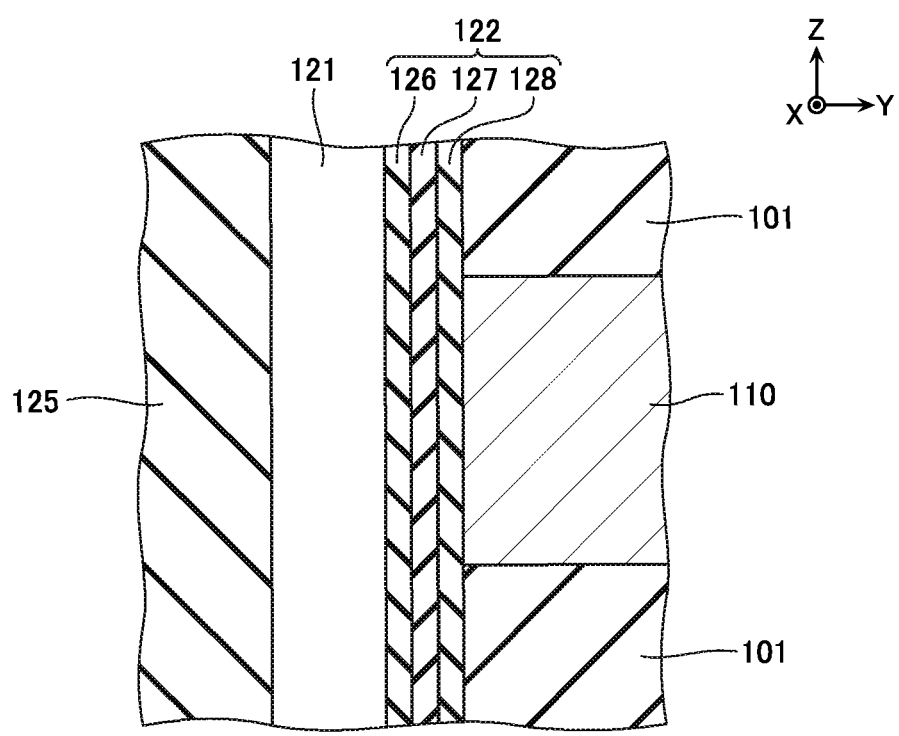
FIG. 9 is an enlarged schematic view of a portion illustrated by A in FIG. 8.

Then, with reference to FIGS. 8 and 9, a configuration example of the memory structure 120 will be described. FIG. 8 is a schematic cross-sectional view taken along A-A' line of the structure in FIGS. 5 to 7 and seen in the direction of the arrow. FIG. 9 is an enlarged schematic view of a portion illustrated by A in FIG. 8.

As illustrated in FIG. 8, the memory structure 120 includes a semiconductor film 121 extending in the Z direction and facing the plurality of conductive layers 110; a gate insulating film 122 interposed between the conductive layers 110 and the semiconductor film 121; a semiconductor film 123 connected to a lower end of the semiconductor film 121; and a semiconductor film 124 connected to an upper end of the semiconductor film 121.

Each semiconductor film 121 functions as channel regions of a plurality of memory cells MCa and a drain select transistor STDa included in one memory unit MUa (FIG. 1). The semiconductor film 121 has a substantially cylindrical shape. An insulating film 125 of silicon oxide ($SiO_2$) and the like is provided on an inner peripheral surface of the semiconductor film 121. The lower end of the insulating film 125 is covered with the semiconductor film 121. The semiconductor film 121 is a semiconductor film of, for example, non-doped polycrystalline silicon (p-Si) and the like.

The gate insulating film 122 includes, for example as illustrated in FIG. 9, a tunnel insulating film 126, a charge storage film 127, and a block insulating film 128 which are laminated between the semiconductor film 121 and the conductive layer 110. The tunnel insulating film 126 and the block insulating film 128 are insulating films of, for example, silicon oxide ($SiO_2$) and the like. The charge storage film 127 is a charge-storable film of, for example, silicon nitride (SiN) and the like.

Each semiconductor film 123 (FIG. 8) functions as a channel region of the source select transistor STSa. A gate insulating film 129 is provided on an outer peripheral surface of the semiconductor film 123. The semiconductor film 123 is a semiconductor film of, for example, single crystal silicon (Si) and the like. The gate insulating film 129 is an insulating film of, for example, silicon oxide and the like.

The semiconductor film 124 is a semiconductor film of, for example, polycrystalline-silicon (p-Si) and the like containing an n-type impurity such as phosphorus. An upper surface of the semiconductor film 124 is connected to the contact 162.

Figure 10:
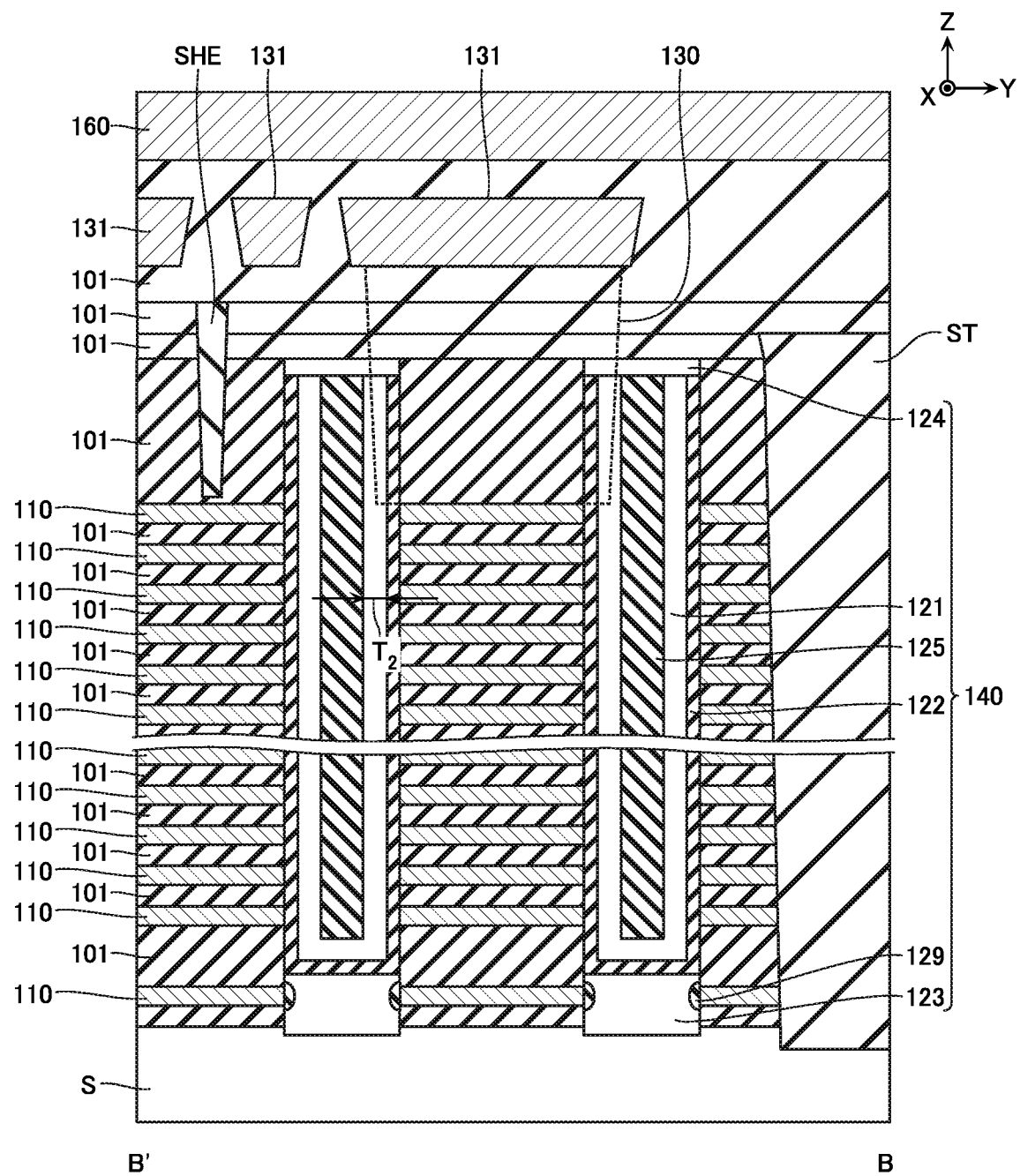
FIG. 10 is a schematic cross-sectional view taken along B-B' line of the structure in FIG. 5 and seen in the direction of the arrow.

Then, with reference to FIG. 10, a configuration example of the structure 140 will be described. FIG. 10 is a schematic cross-sectional view taken along B-B' line of the structure in FIGS. 5 to 7 and seen in the direction of the arrow.

As illustrated in FIG. 10, the structure 140 includes a semiconductor film 121 extending in the Z direction and facing the plurality of conductive layers 110; a gate insulating film 122 interposed between the conductive layers 110 and the semiconductor film 121; a semiconductor film 123 provided below the semiconductor film 121; and a semiconductor film 124 connected to an upper end of the semiconductor film 121.

In other words, the structure 140 has substantially the same structure as the memory structure 120. Note that in the example illustrated in the drawing, the outer diameter of the structure 140 is greater than the outer diameter of the memory structure 120. Note also that in the structure 140, the lower end of the semiconductor film 121 is covered with the gate insulating film 122 and the semiconductor film 121 is electrically isolated from the semiconductor film 123. Note also that in the structure 140, the semiconductor film 124 is not connected to the contact 162 (FIG. 8) and electrically isolated from the wiring 160.

Figure 11:
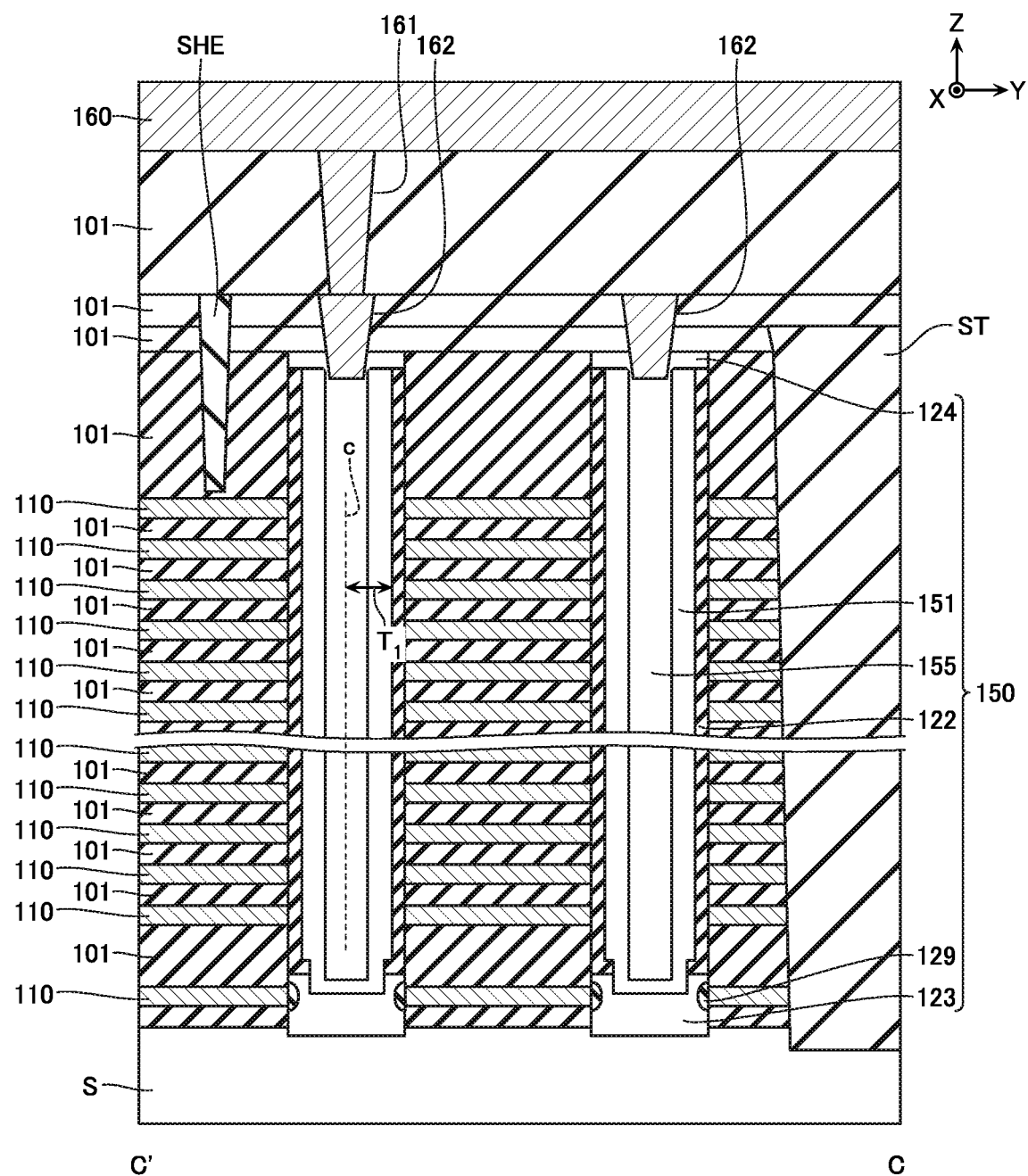
FIG. 11 is a schematic cross-sectional view taken along C-C' line of the structure in FIG. 5 and seen in the direction of the arrow.

Then, with reference to FIG. 11, a configuration example of the structure 150 will be described. FIG. 11 is a schematic cross-sectional view taken along C-C' line of the structure in FIGS. 5 to 7 and seen in the direction of the arrow.

As illustrated in FIG. 11, the structure 150 includes a semiconductor film 151 extending in the Z direction and facing the plurality of conductive layers 110; a gate insulating film 122 interposed between the conductive layers 110 and the semiconductor film 151; a semiconductor film 123 connected to a lower end of the semiconductor film 151; and a semiconductor film 124 connected to an upper end of the semiconductor film 151.

Each semiconductor film 151 functions as channel regions of a plurality of memory cells MCb and the drain select transistor STDb included in one memory unit MUb (FIG. 1). The semiconductor film 151 has a substantially cylindrical shape. A semiconductor film 155 is provided on an inner peripheral surface of the semiconductor film 151. The lower end of the semiconductor film 155 is covered with the semiconductor film 151.

The semiconductor film 155 is polycrystalline-silicon, for example, containing an n-type impurity such as phosphorus (P). The semiconductor film 151 is a semiconductor film of, for example, non-doped polycrystalline silicon and the like. Note that the impurity doped into the semiconductor film 155 may diffuse into the semiconductor film 151. Note that the semiconductor film 121 (FIGS. 8 to 10) in the memory structure 120 and the structure 140 is basically not doped with an impurity. The concentration of the impurity at least in the semiconductor films 151 and 155 is higher than the concentration of the impurity in the semiconductor film 121.

The thickness in a radial direction of the semiconductor film 155 may be changed as needed. In addition, a central portion of the structure 150 may or may not be buried with the semiconductor film 155. In any case, for example, when the semiconductor film 151 and the semiconductor film 155 are regarded as one semiconductor film, the thickness $T_1$ in the radial direction of this semiconductor film (the shortest distance from an inner peripheral surface or a central axis c of the semiconductor film 155 to the gate insulating film 122) is greater than the thickness $T_2$ in the radial direction of the semiconductor film 121 in the memory structure 120 and the structure 140 (the shortest distance from the insulating film 125 to the gate insulating film 122. See FIGS. 8 and 10).

[Writing Operation]

In the present embodiment, for example, multi-valued data such as four-valued data, eight-valued data, and 16-valued data may be recorded in a plurality of memory cells MCa (FIG. 1). Alternatively, binary data may be recorded in the memory cells MCb. In writing operation, for example, multi-valued data to be recorded in the memory cells MCa is recorded as binary data in the memory cells MCb. Recording such binary data can be performed at a higher speed than recording multi-valued data. Then, with sequential reference to binary data recorded in the memory cells MCb, the binary data is recorded as multi-valued data in the memory cells MCa.

[Manufacturing Method]

Then, with reference to FIGS. 12 to 35, the manufacturing method for the semiconductor memory device according to the present embodiment will be described. FIGS. 12, 13, 15, 16, 18, 20, 23, 27, 30, and 33 to 35 illustrate a cross-section corresponding to FIG. 8. FIGS. 14, 17, 21, 24, 28, and 31 illustrate a cross-section corresponding to FIG. 10. FIGS. 19, 22, 25, 26, 29, and 32 illustrate a cross-section corresponding to FIG. 11.

Figure 12:
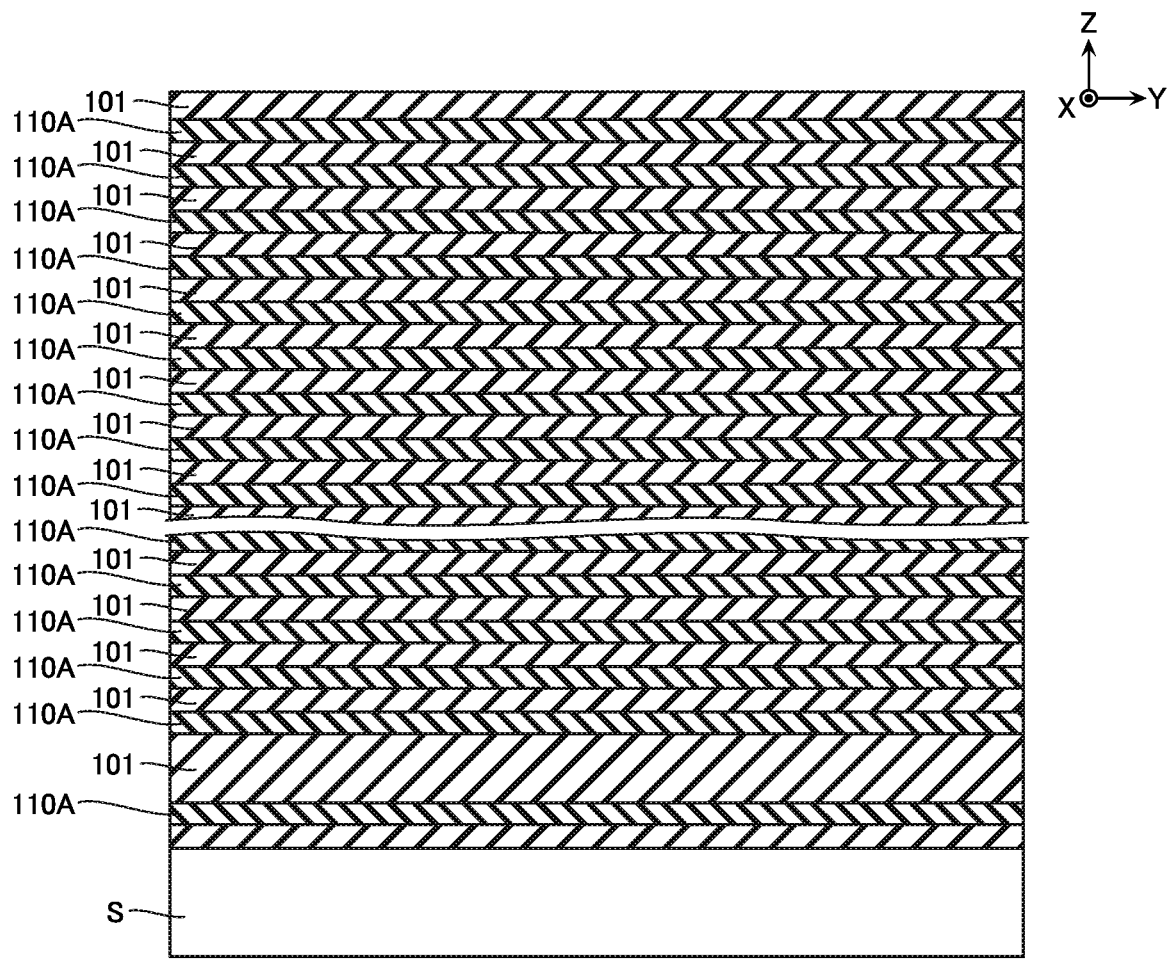
FIG. 12 is a schematic cross-sectional view of a manufacturing method for the semiconductor memory device.

As illustrated in FIG. 12, in the manufacturing method, a plurality of sacrificial layers 110A and insulating layers 101 are formed on the substrate S. The sacrificial layer 110A is formed of, for example, silicon nitride (SiN) or the like. This step is performed, for example, by a chemical vapor deposition (CVD) method or the like.

Figure 13:
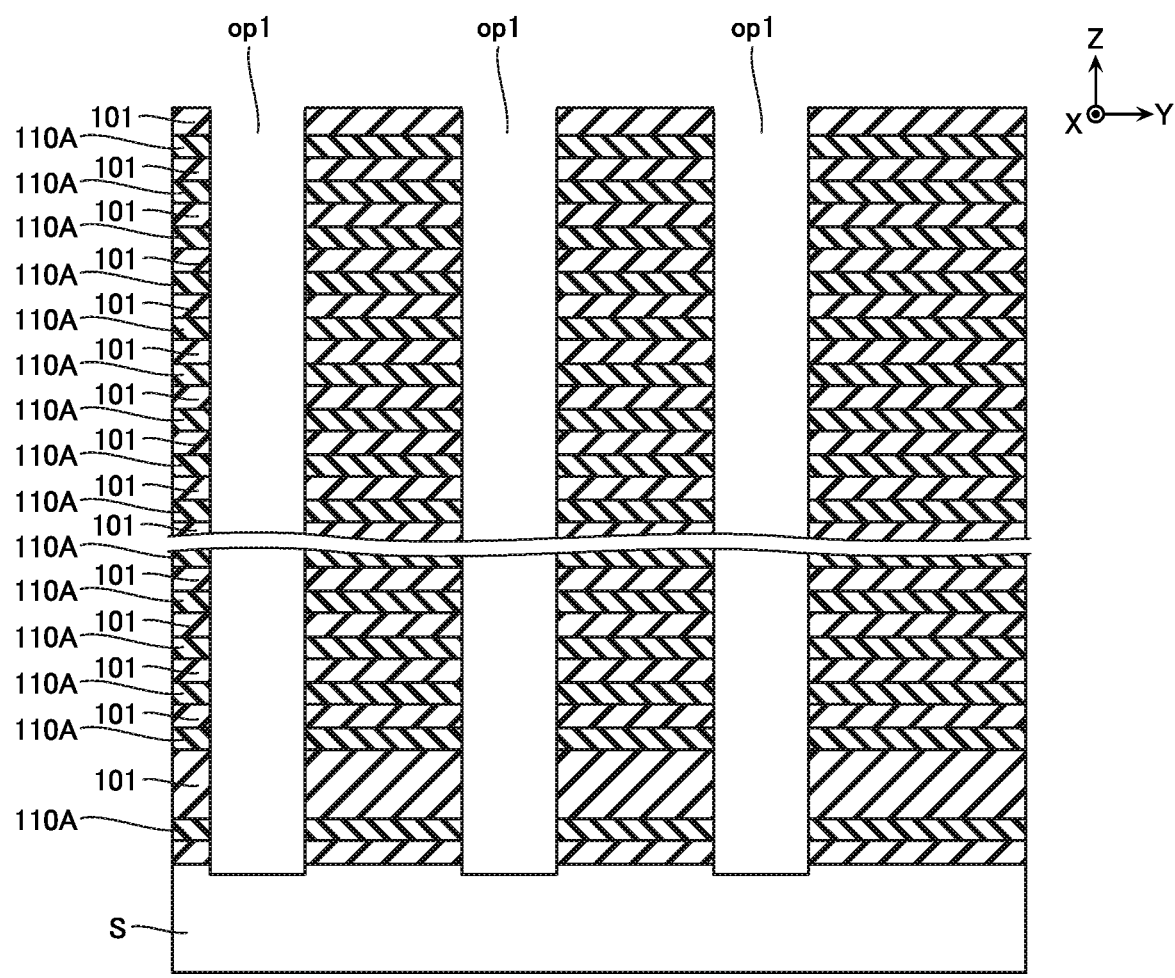
FIG. 13 is a schematic cross-sectional view of the manufacturing method.
Figure 14:
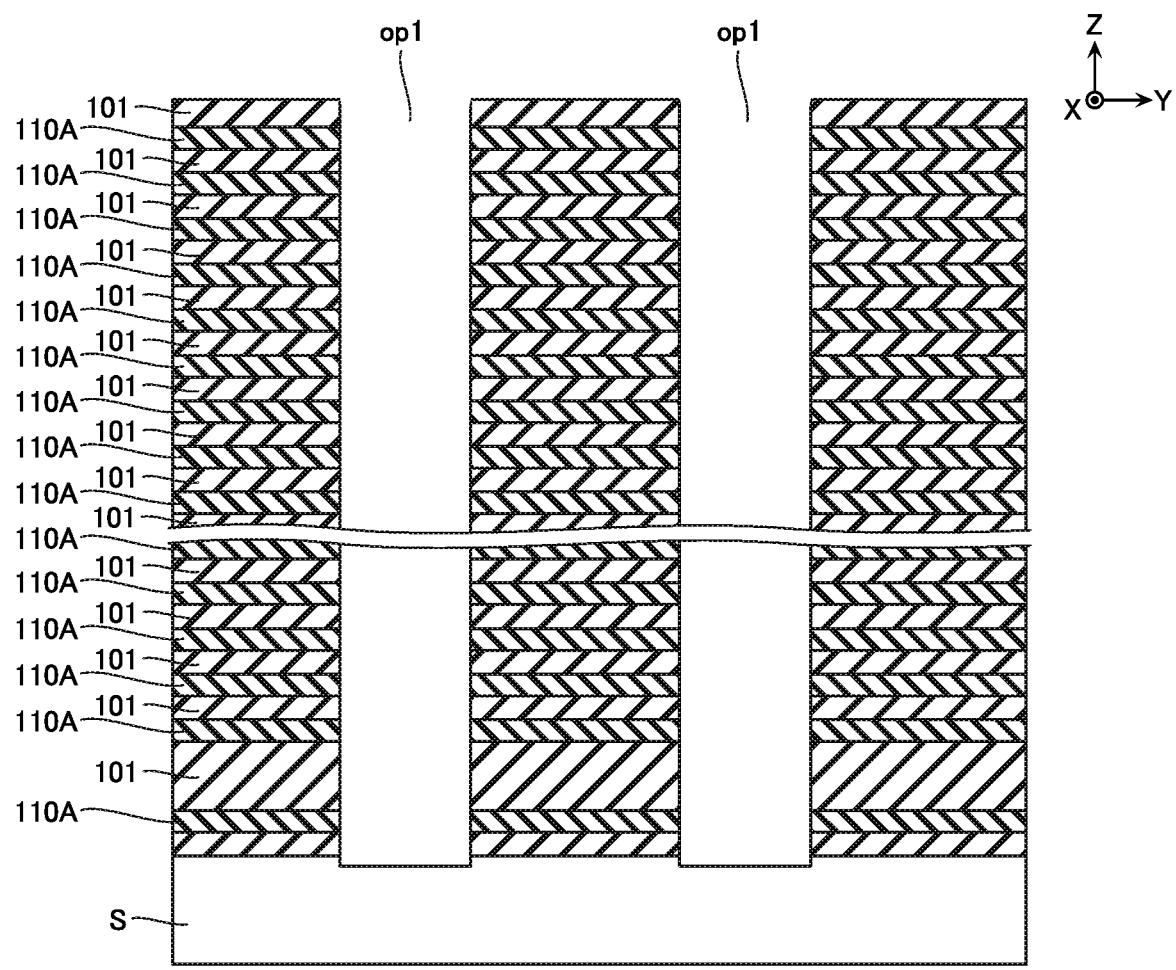
FIG. 14 is a schematic cross-sectional view of the manufacturing method.

Then, as illustrated in FIGS. 13 and 14, a plurality of openings op1 are formed at positions corresponding to the memory structure 120, the structure 140, and the structure 150. The opening op1 is a through-hole extending in the Z direction, penetrating through the insulating layers 101 and the sacrificial layers 110A, and exposing the upper surface of the substrate S. This step is performed, for example, by a reactive ion etching (RIE) method or the like.

Figure 15:
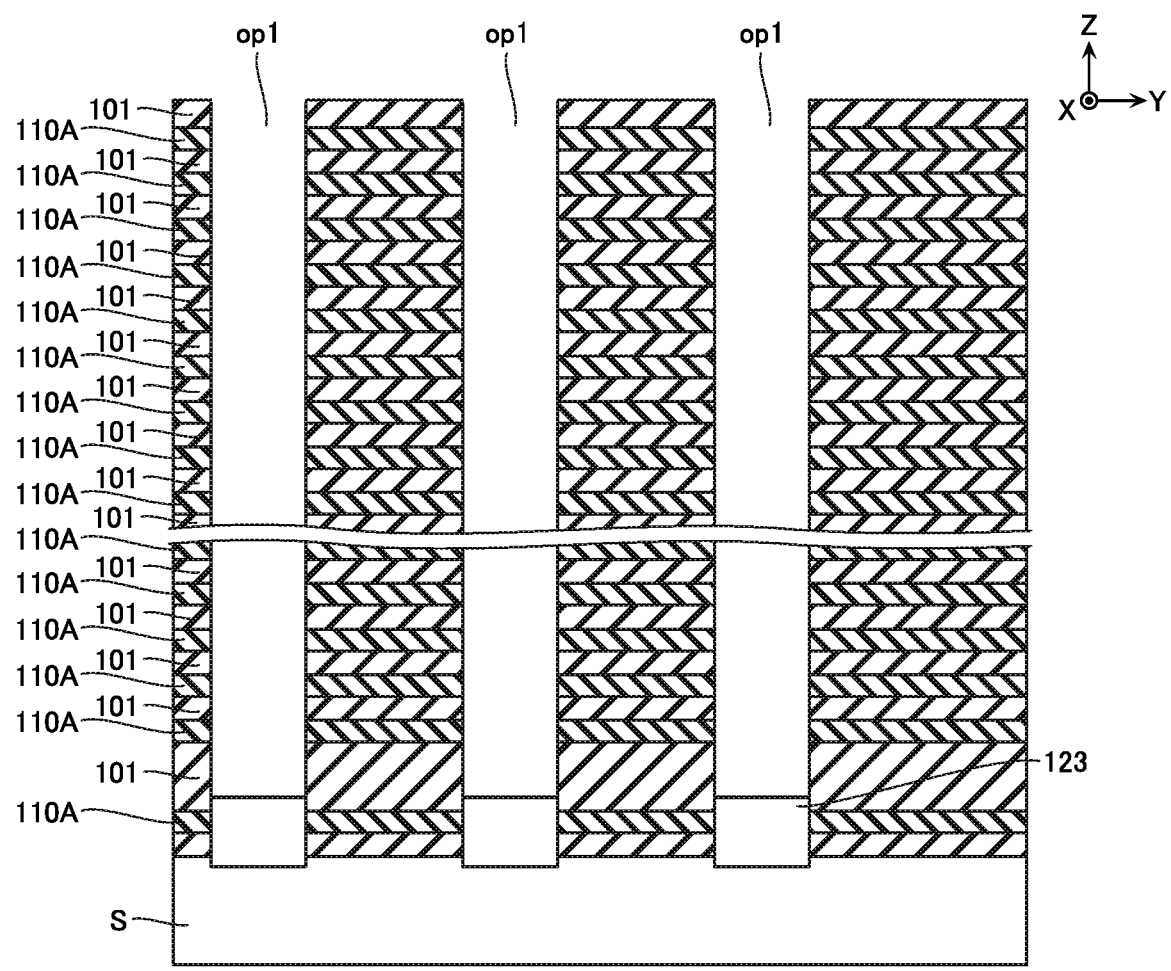
FIG. 15 is a schematic cross-sectional view of the manufacturing method.

Then, as illustrated in FIG. 15, a semiconductor film 123 is formed on a bottom surface of the opening op1. This step is performed, for example, by an epitaxial growth method or the like.

Figure 16:
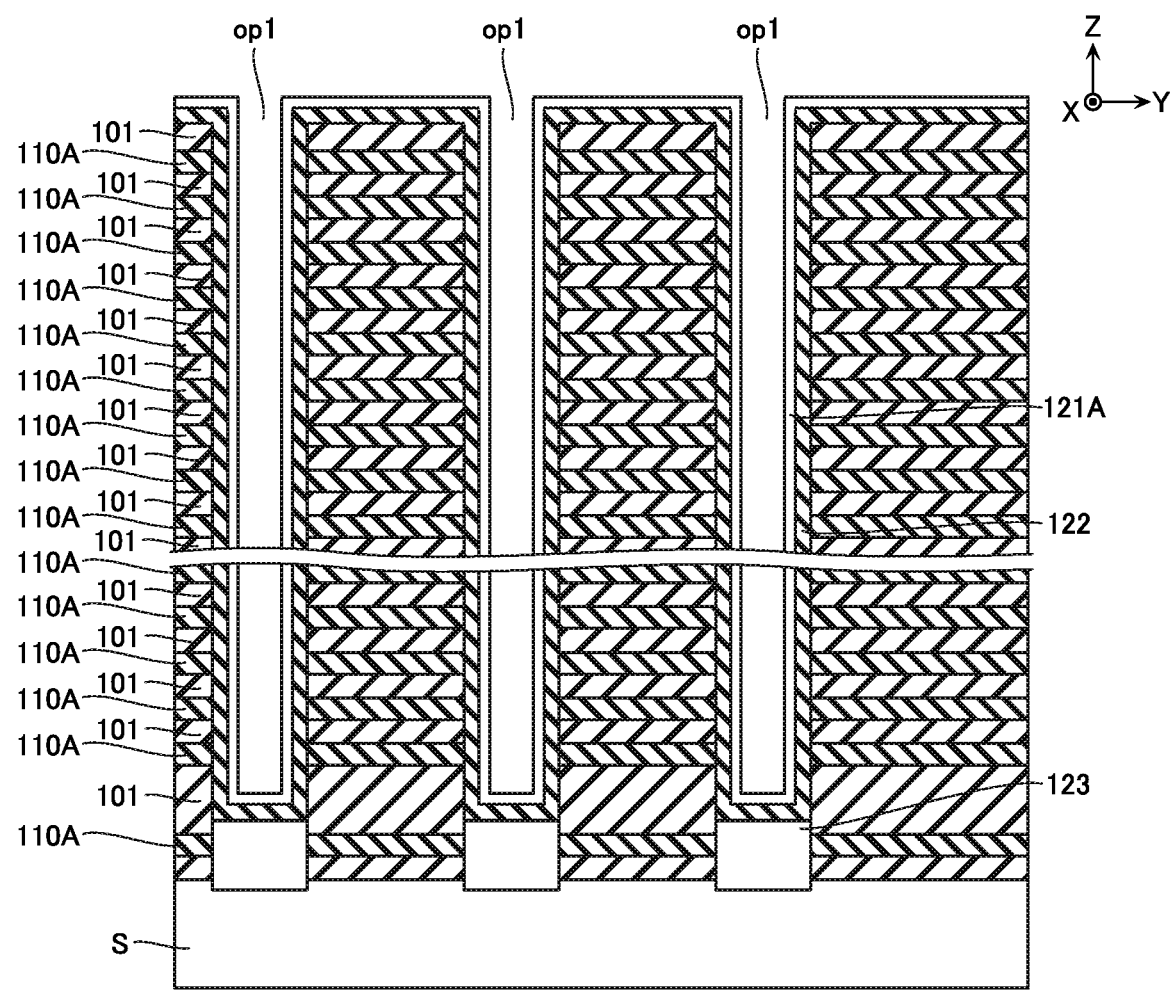
FIG. 16 is a schematic cross-sectional view of the manufacturing method.
Figure 17:
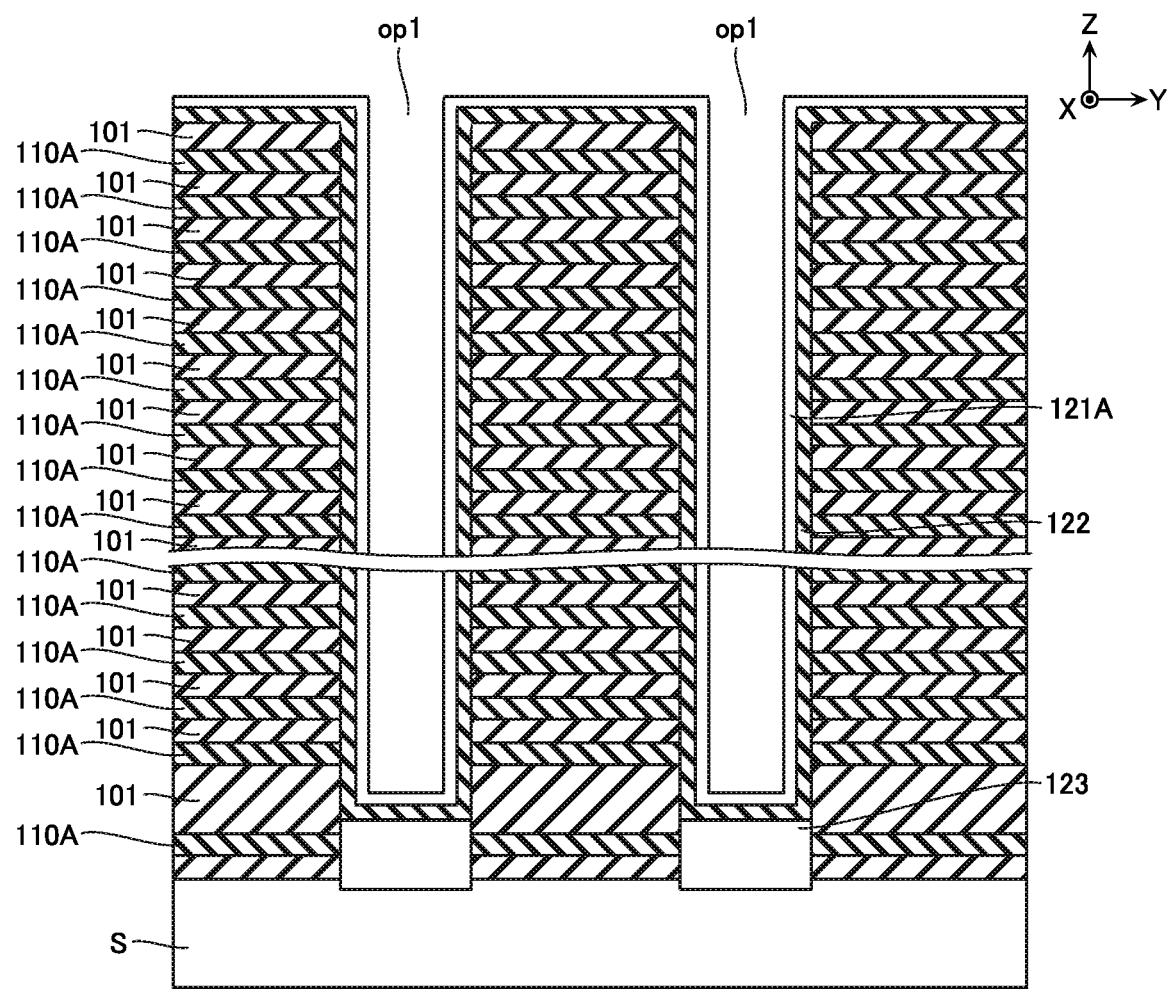
FIG. 17 is a schematic cross-sectional view of the manufacturing method.

Then, as illustrated in FIGS. 16 and 17, a gate insulating film 122 and an amorphous silicon film 121A are formed on an upper surface of the semiconductor film 123 and an inner peripheral surface of the opening op1. This step is performed, for example, by a CVD method or the like.

Figure 18:
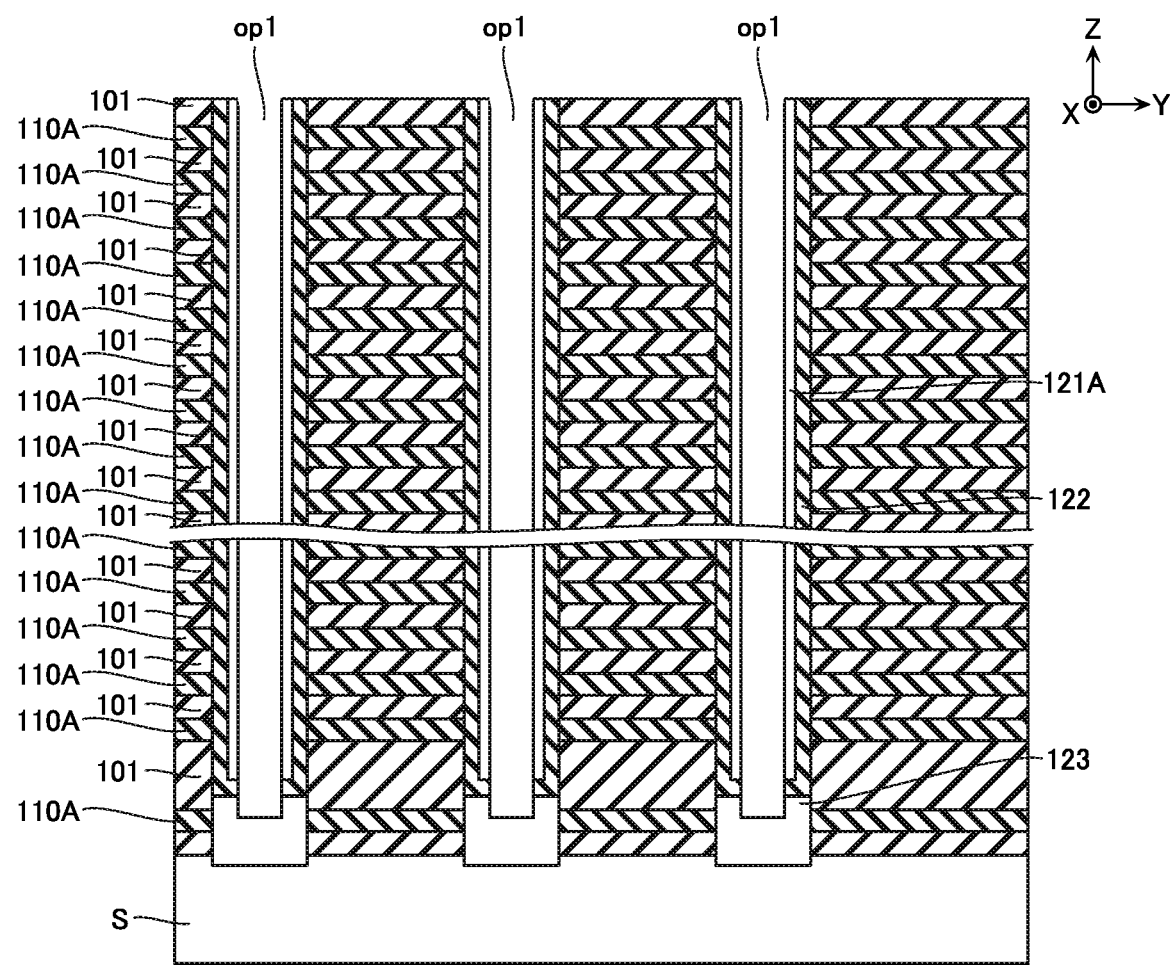
FIG. 18 is a schematic cross-sectional view of the manufacturing method.
Figure 19:
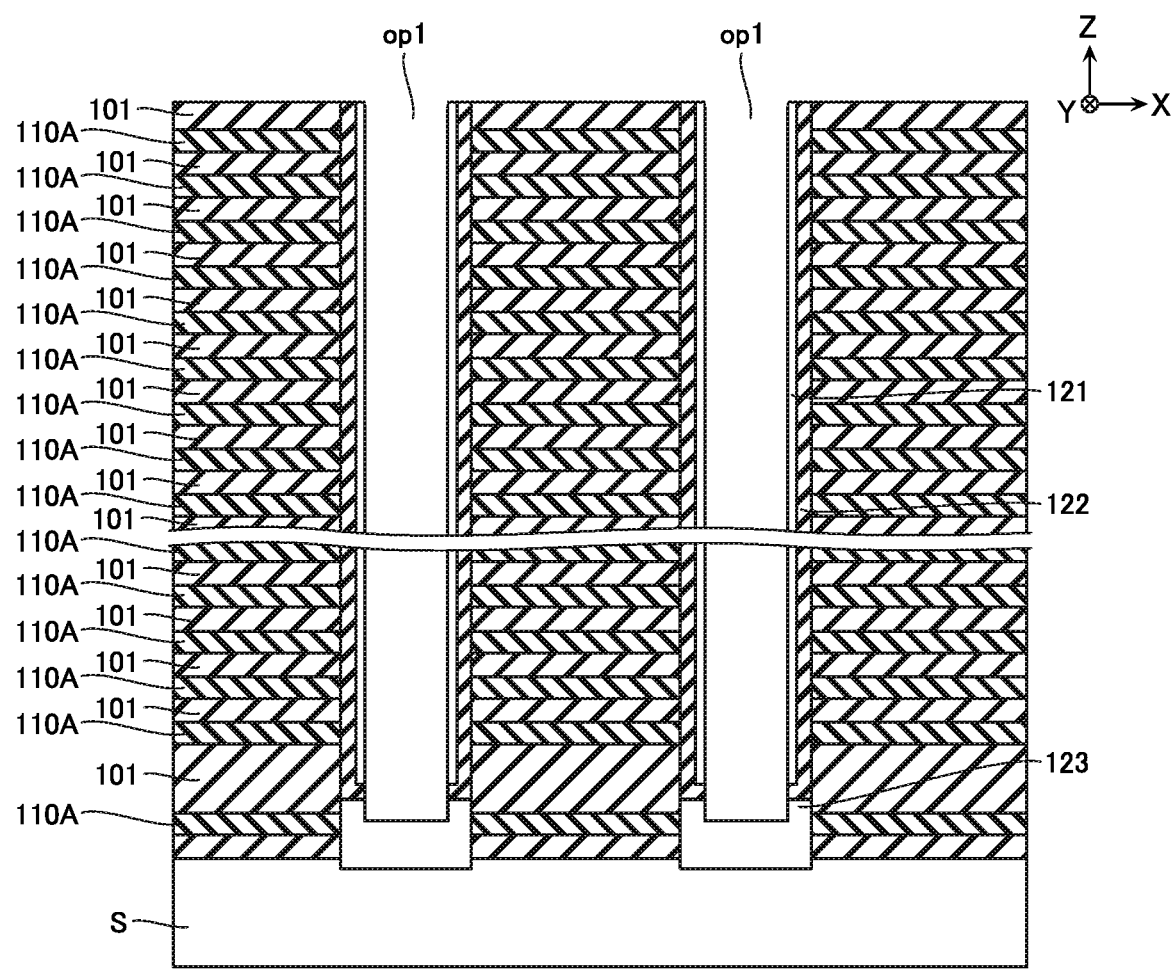
FIG. 19 is a schematic cross-sectional view of the manufacturing method.

Then, as illustrated in FIGS. 18 and 19, in the openings op1 corresponding to the memory structure 120 and the structure 150, a portion of the gate insulating film 122 and the amorphous silicon film 121A which cover the upper surface of the semiconductor film 123 is removed. This step is performed, for example, by the RIE method or the like. Note that in this step, the opening op1 corresponding to the structure 140 may be covered with a mask or the like.

Figure 20:
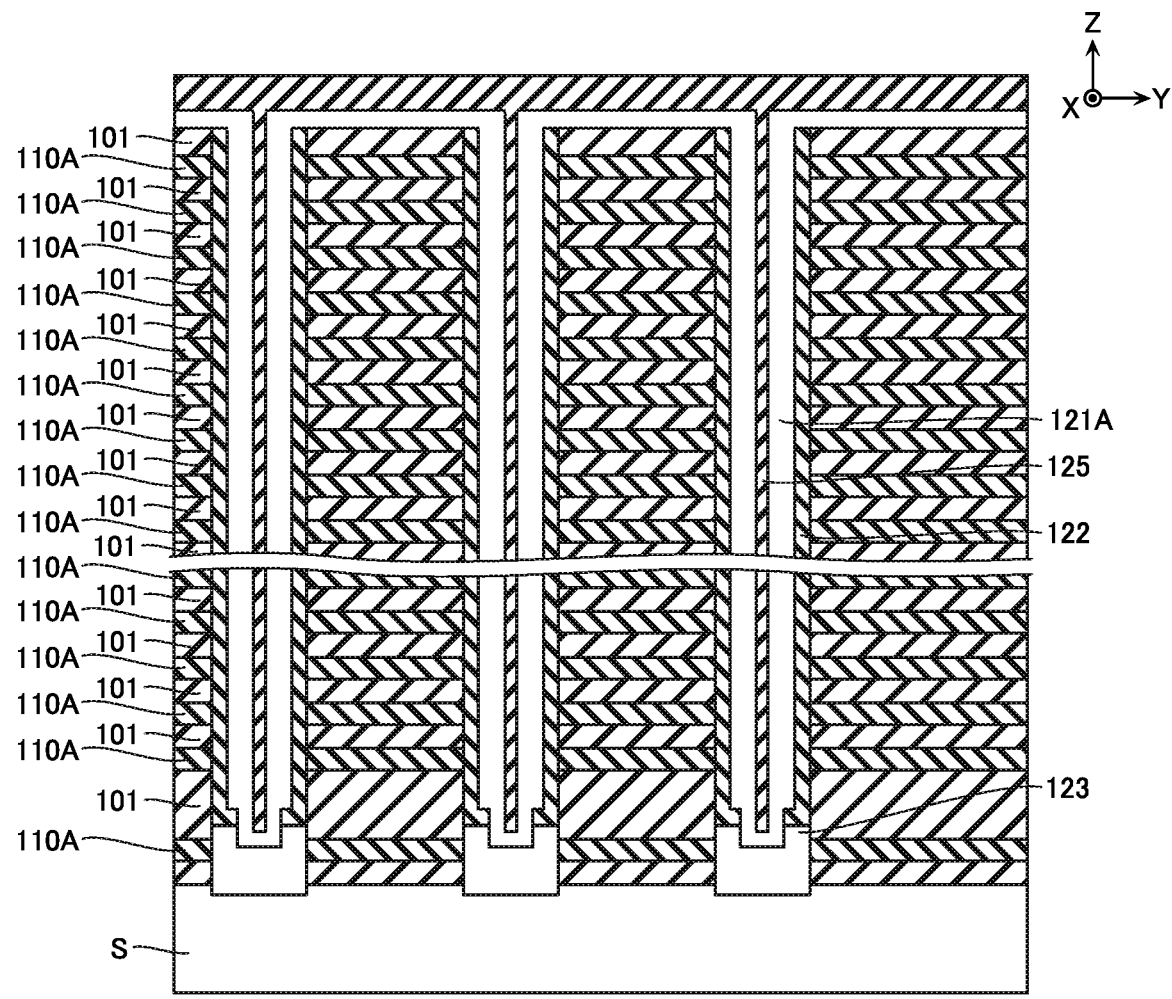
FIG. 20 is a schematic cross-sectional view of the manufacturing method.
Figure 21:
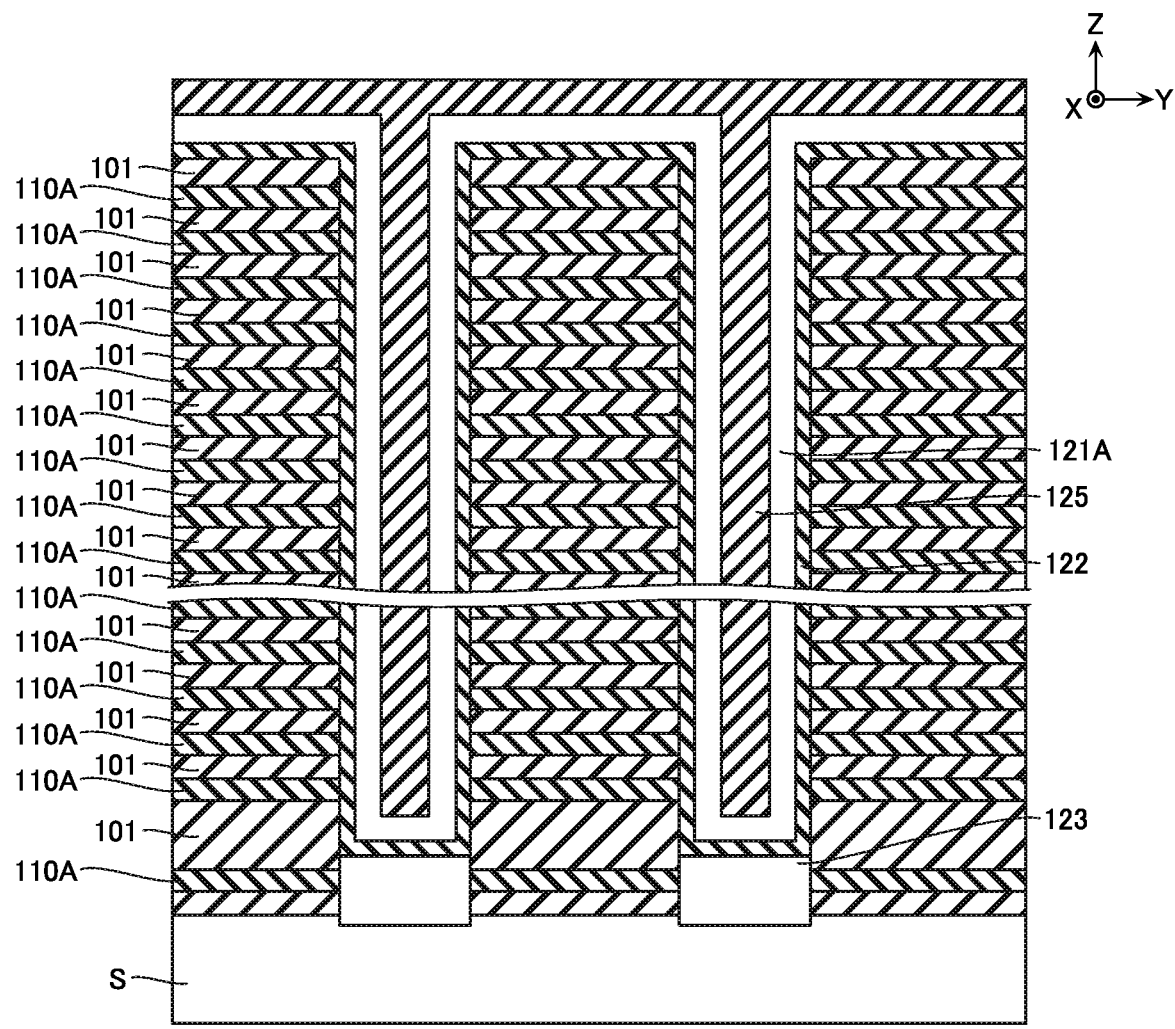
FIG. 21 is a schematic cross-sectional view of the manufacturing method.
Figure 22:
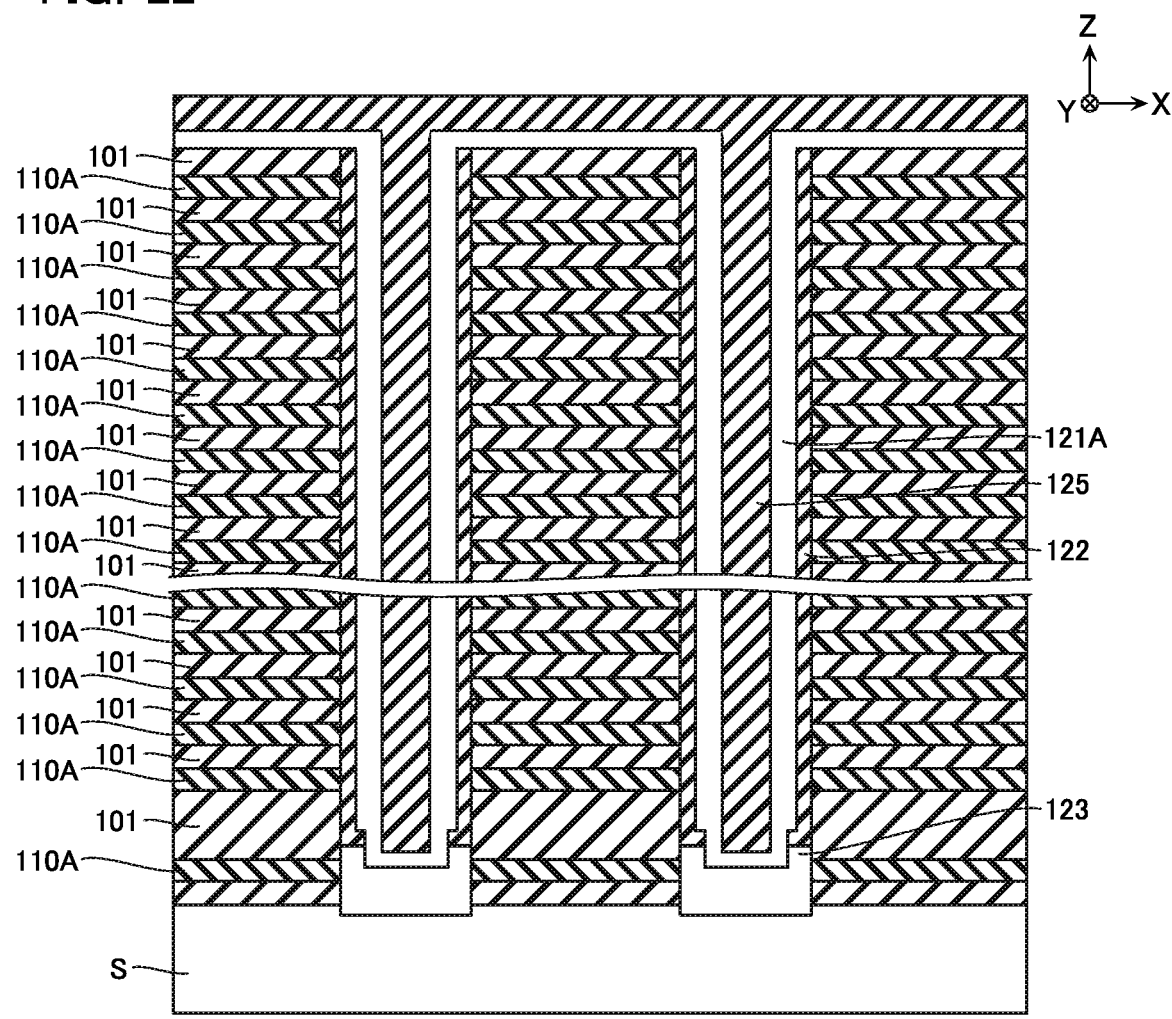
FIG. 22 is a schematic cross-sectional view of the manufacturing method.

Then, as illustrated in FIGS. 20 to 22, an amorphous silicon film 121A and an insulating film 125 are formed inside the openings op1. As illustrated in FIGS. 20 and 22, in the openings op1 corresponding to the memory structure 120 and the structure 150, the amorphous silicon film 121A is formed on the upper surface of the semiconductor film 123. Meanwhile, as illustrated in FIG. 21, in the opening op1 corresponding to the structure 140, the amorphous silicon film 121A is not formed on the upper surface of the semiconductor film 123. This step is performed, for example, by a CVD method or the like. Thereafter, a crystal structure of the amorphous silicon film 121A is modified by an annealing treatment or the like to form the semiconductor film 121.

Figure 23:
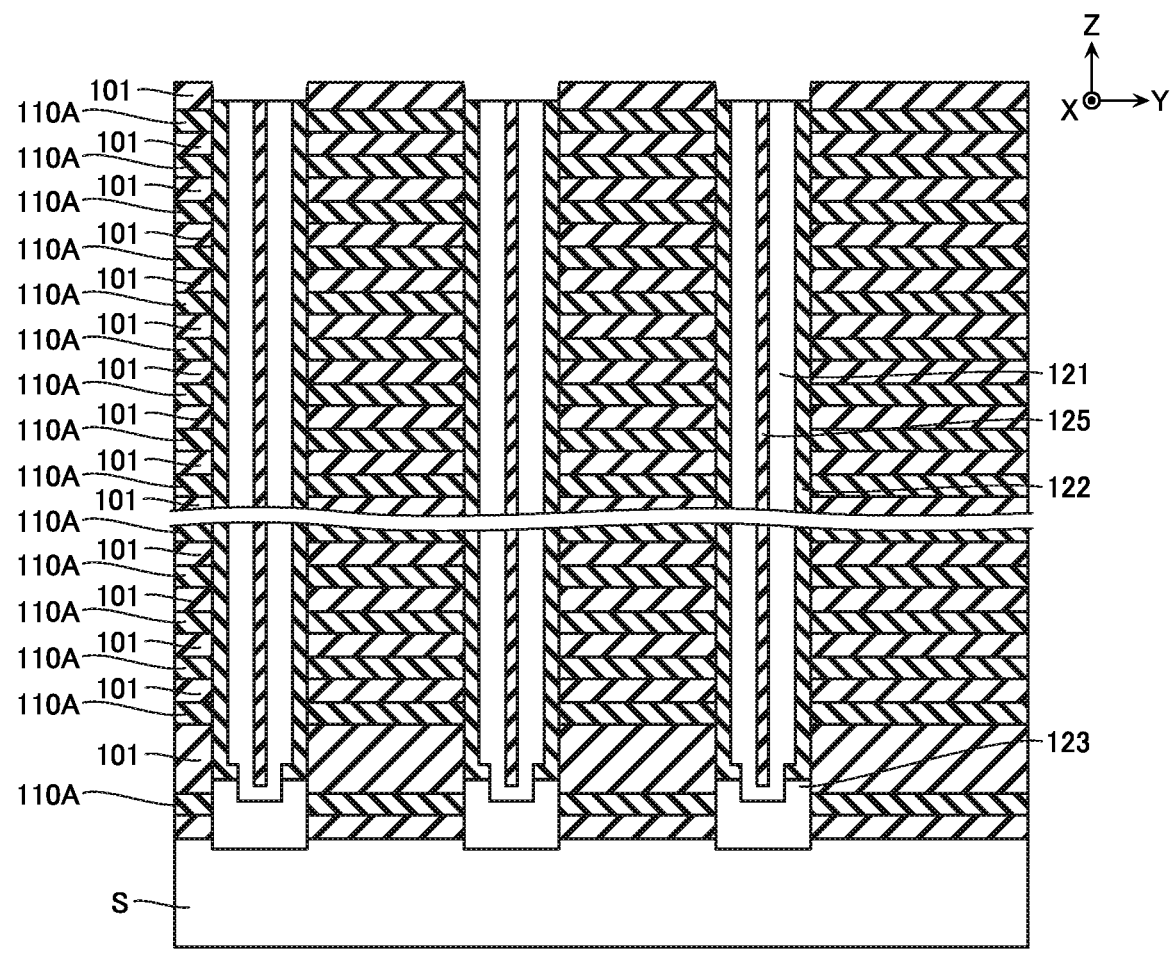
FIG. 23 is a schematic cross-sectional view of the manufacturing method.
Figure 24:
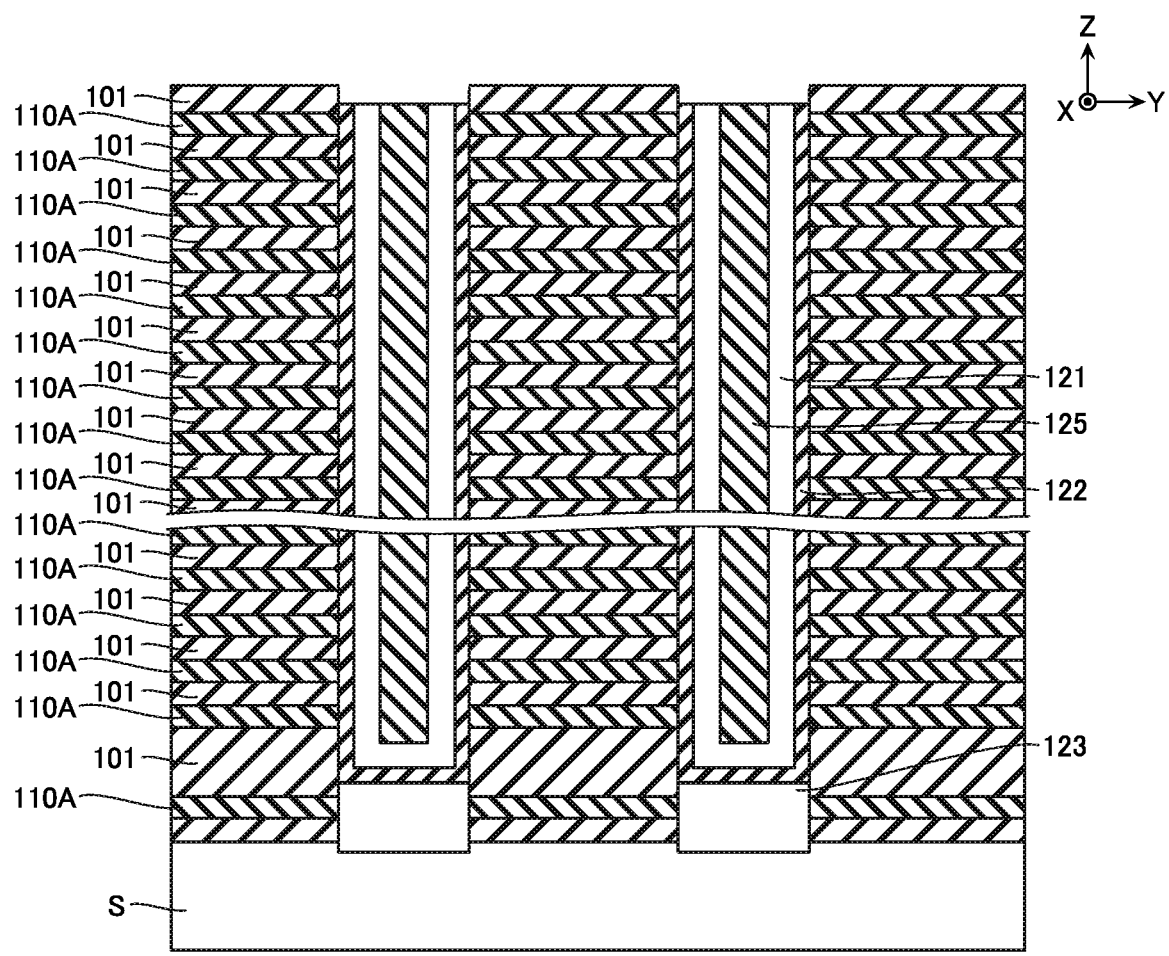
FIG. 24 is a schematic cross-sectional view of the manufacturing method.
Figure 25:
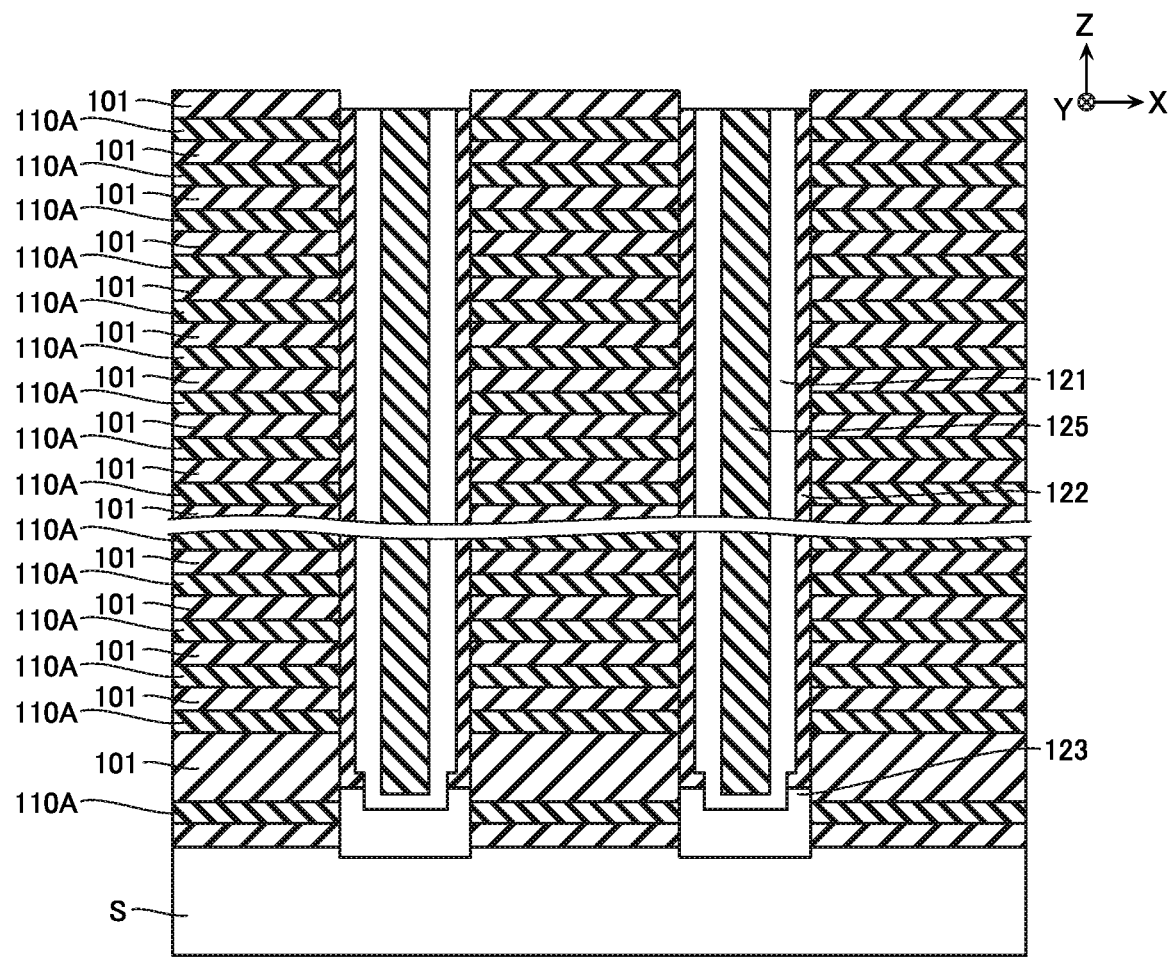
FIG. 25 is a schematic cross-sectional view of the manufacturing method.

Then, as illustrated in FIGS. 23 to 25, a part of the insulating film 125, the semiconductor film 121, and the gate insulating film 122 is removed to expose the insulating layer 101 located in an uppermost layer. Further, the upper surfaces of the semiconductor film 121 and the insulating film 125 are made lower than the upper surface of the insulating layer 101 located in the uppermost layer. This step is performed, for example, by the RIE method or the like.

Figure 26:
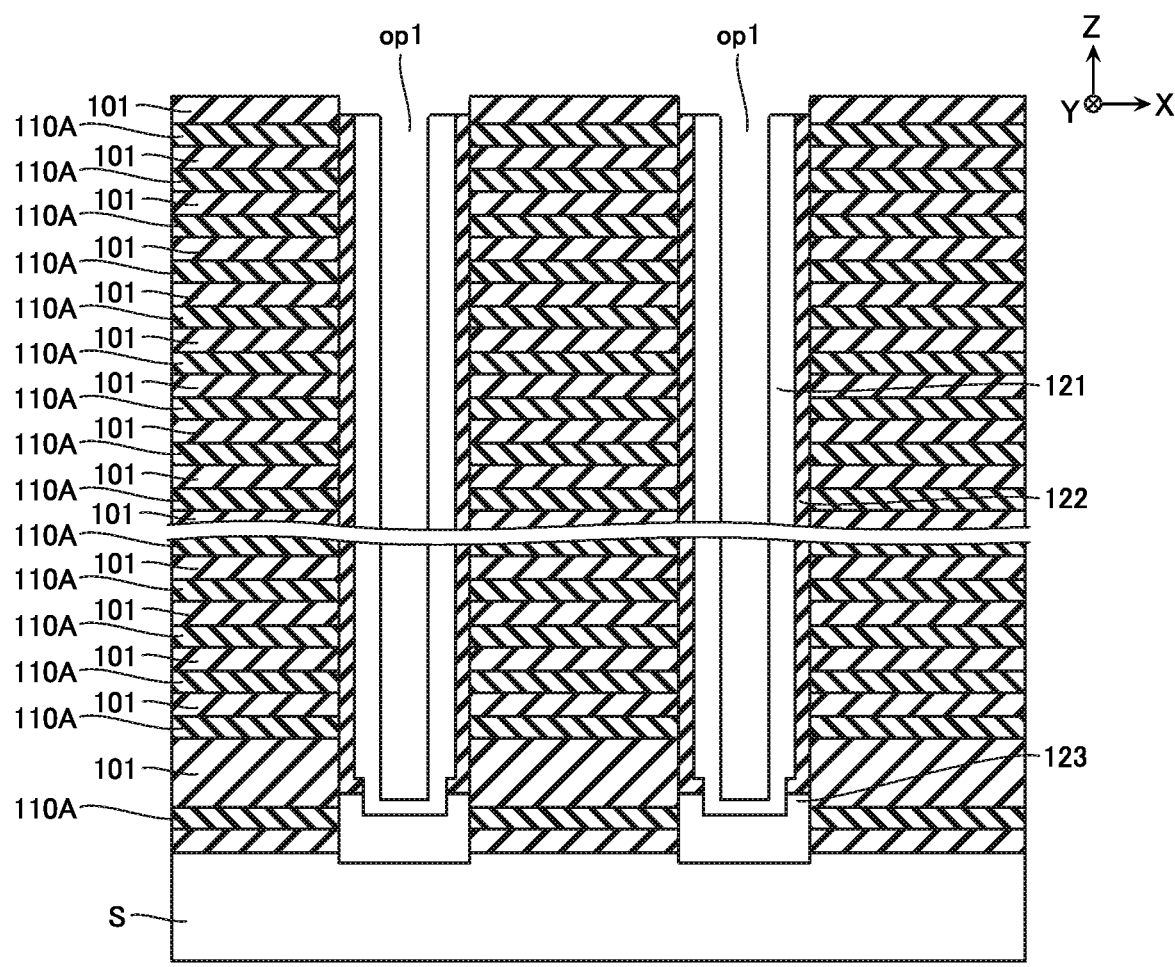
FIG. 26 is a schematic cross-sectional view of the manufacturing method.

Then, as illustrated in FIG. 26, in the opening op1 corresponding to the structure 150, the insulating film 125 is removed. This step is performed, for example, by a wet etching method or the like. Note that in this step, the openings op1 corresponding to the memory structure 120 and the structure 140 may be covered with a mask or the like.

Figure 27:
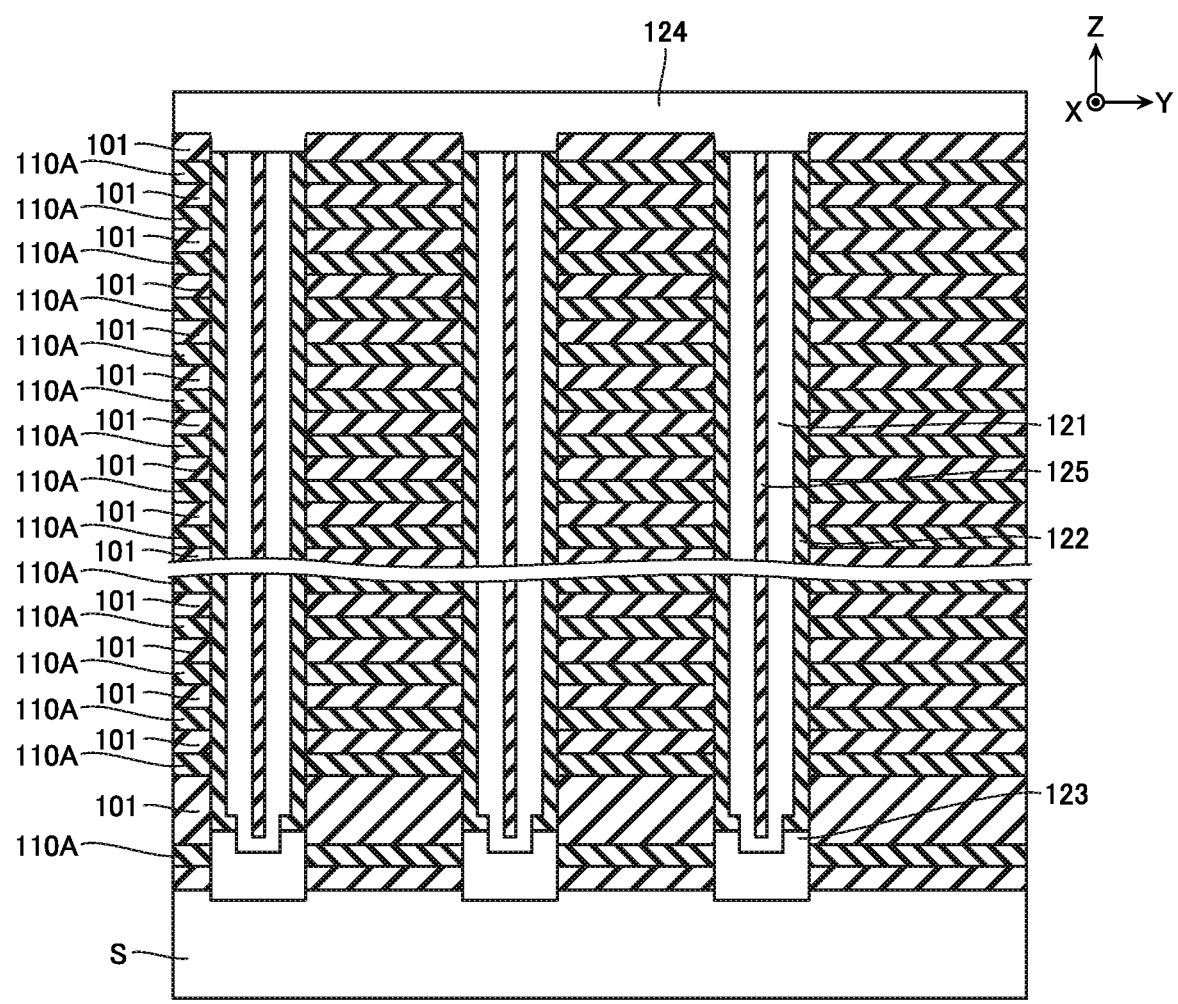
FIG. 27 is a schematic cross-sectional view of the manufacturing method.
Figure 28:
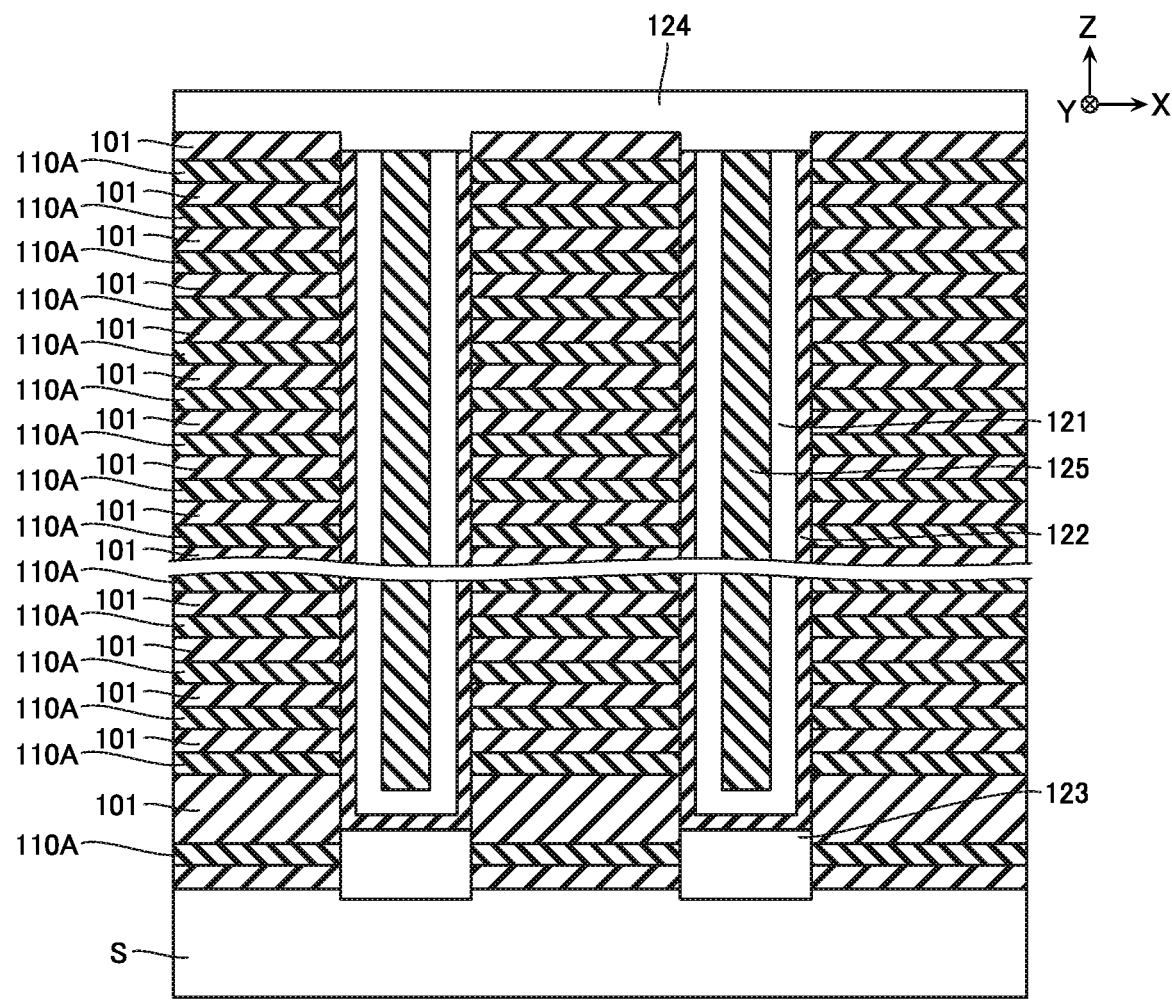
FIG. 28 is a schematic cross-sectional view of the manufacturing method.
Figure 29:
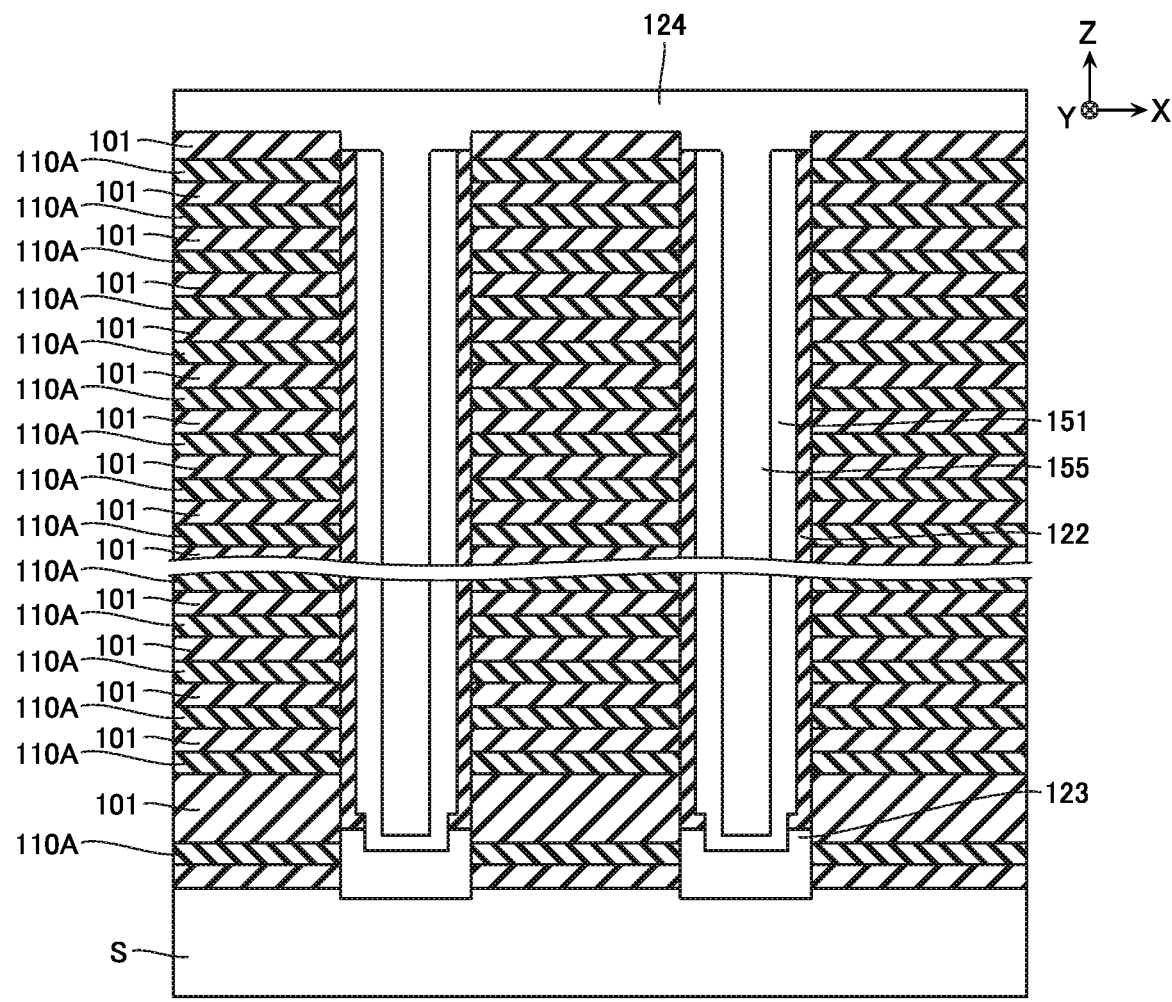
FIG. 29 is a schematic cross-sectional view of the manufacturing method.

Then, as illustrated in FIGS. 27 to 29, a semiconductor film 124 is formed. As illustrated in FIGS. 27 and 28, in portions corresponding to the memory structure 120 and the structure 140, the semiconductor film 124 is formed on the upper surface of the semiconductor film 121. Further, as illustrated in FIG. 29, in a portion corresponding to the structure 150, not only the semiconductor film 124 is formed on the upper surface of the semiconductor film 121 but also a semiconductor film 155 is formed on an inner peripheral surface and a bottom surface of the semiconductor film 121. Further, the semiconductor film 121 becomes a semiconductor film 151. This step is performed, for example, by the CVD method or the like.

Figure 30:
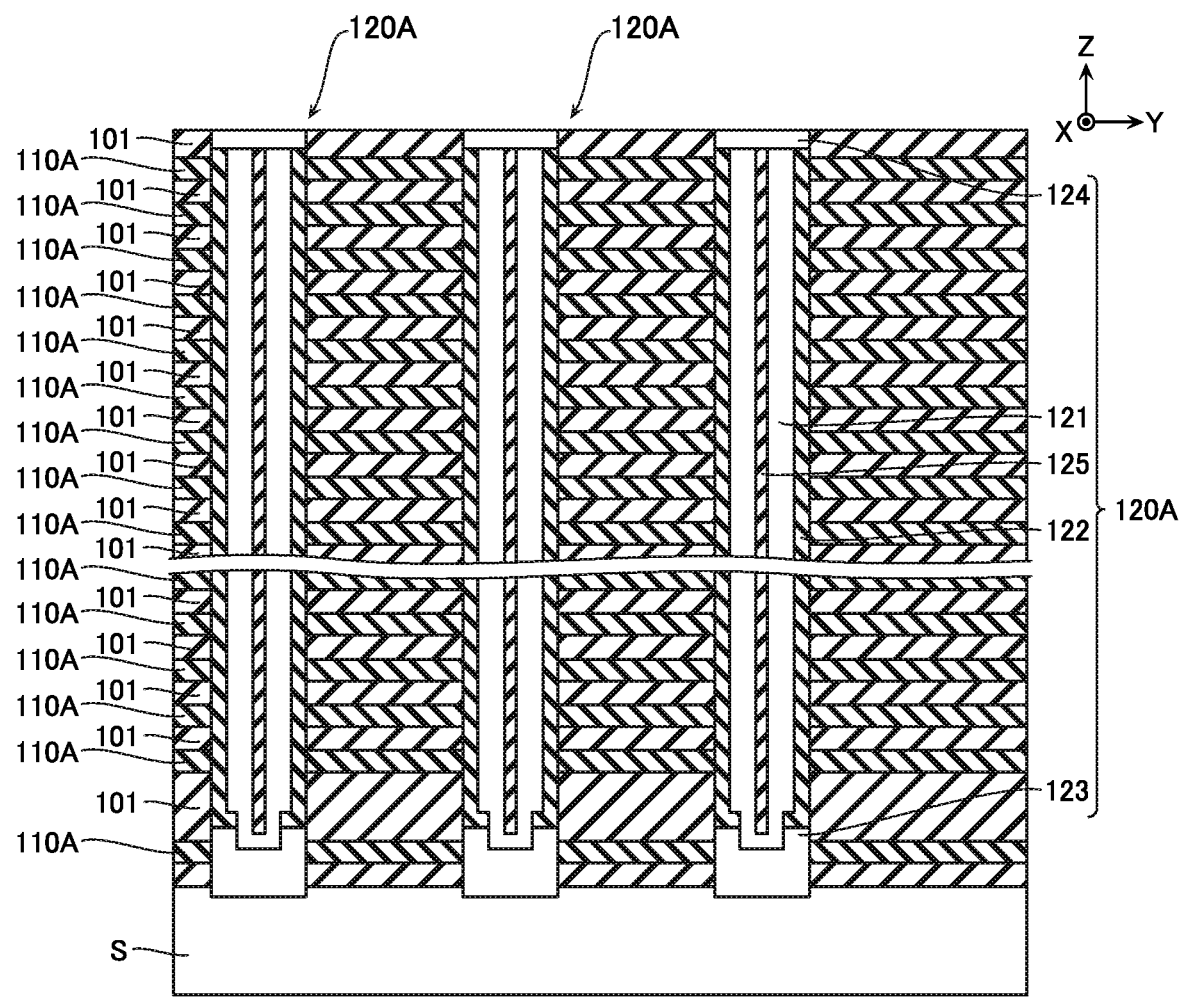
FIG. 30 is a schematic cross-sectional view of the manufacturing method.
Figure 31:
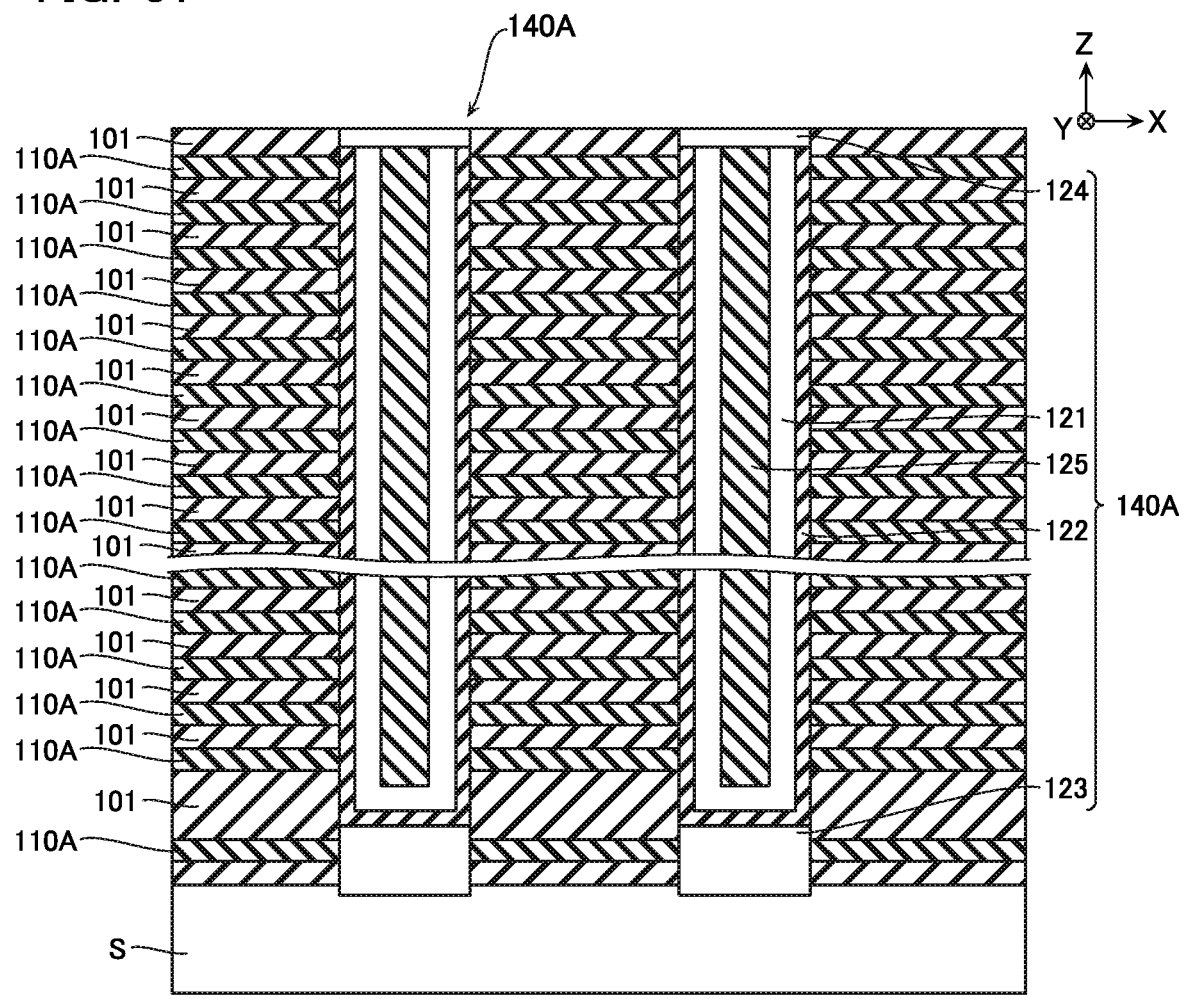
FIG. 31 is a schematic cross-sectional view of the manufacturing method.
Figure 32:
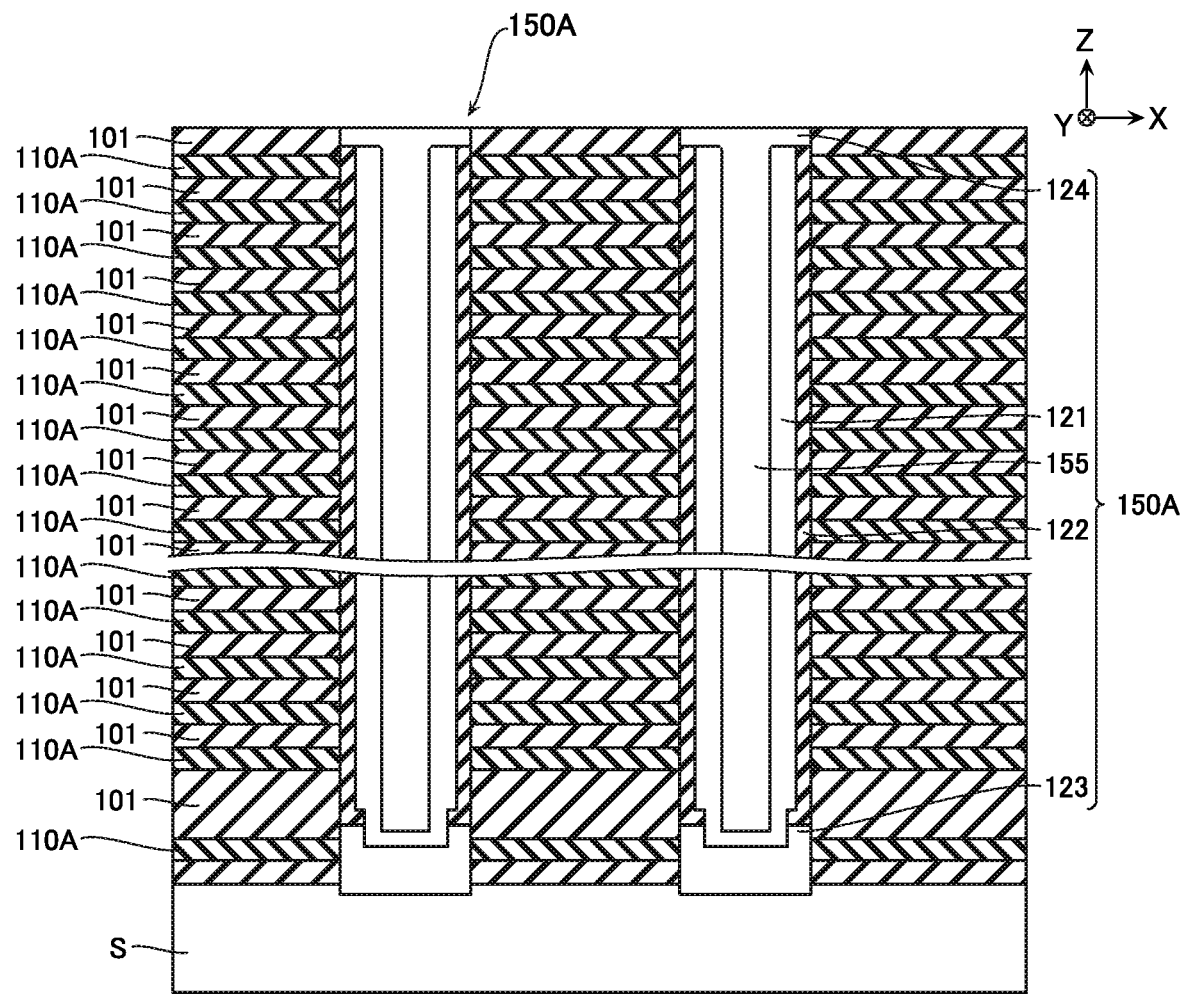
FIG. 32 is a schematic cross-sectional view of the manufacturing method.

Then, as illustrated in FIGS. 30 to 32, part of the semiconductor film 124 is removed to expose the insulating layer 101 located in the uppermost layer. Thus, substantially cylindrical structures 120A, 140A, and 150A are formed. This step is performed, for example, by the RIE method or the like.

Figure 33:
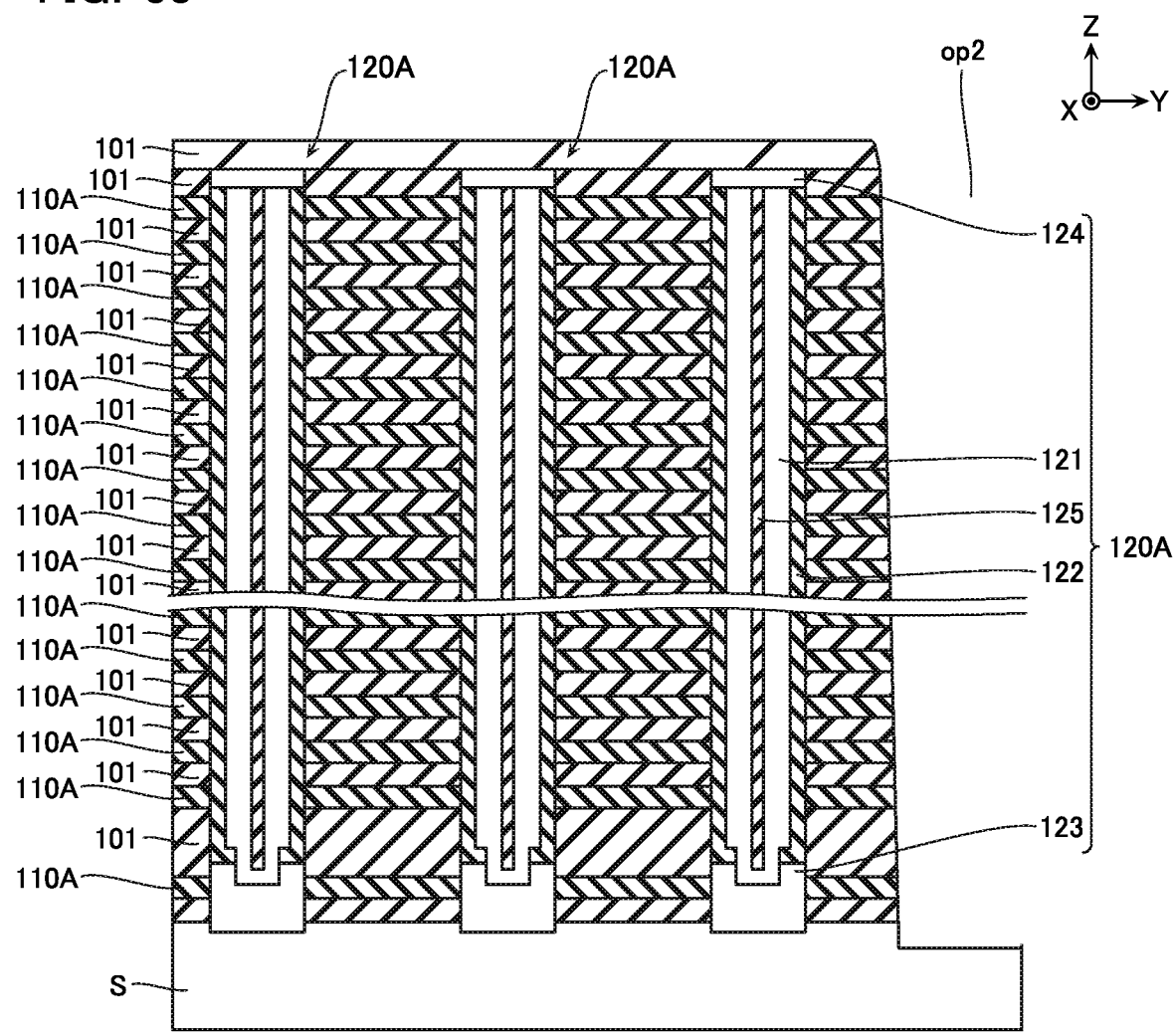
FIG. 33 is a schematic cross-sectional view of the manufacturing method.

Then, as illustrated in FIG. 33, an opening op2 is formed at a position corresponding to an insulating portion ST. The opening op2 is a groove extending in the Z direction and the X direction, dividing the insulating layers 101 and the sacrificial layers 110A in the Y direction, and exposing an upper surface of the substrate S. This step is performed, for example, by the RIE method or the like.

Figure 34:
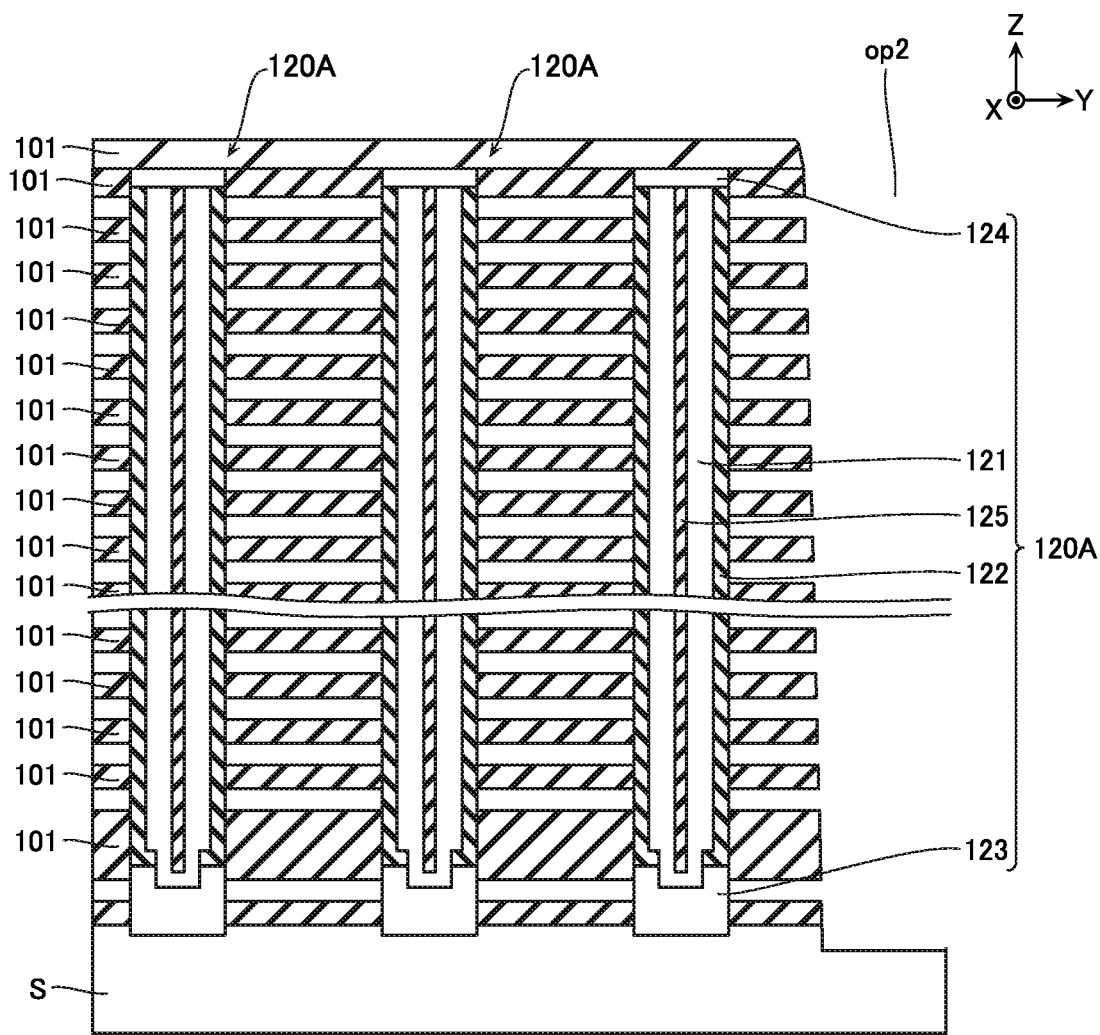
FIG. 34 is a schematic cross-sectional view of the manufacturing method.

Then, as illustrated in FIG. 34, the sacrificial layers 110A are removed via the opening op2. Thus, there is formed a hollow structure including the plurality of insulating layers 101 arranged in the Z direction and the structures 120A, 140A, and 150A supporting these insulating layers 101. This step is performed, for example, by a wet etching method or the like.

Figure 35:
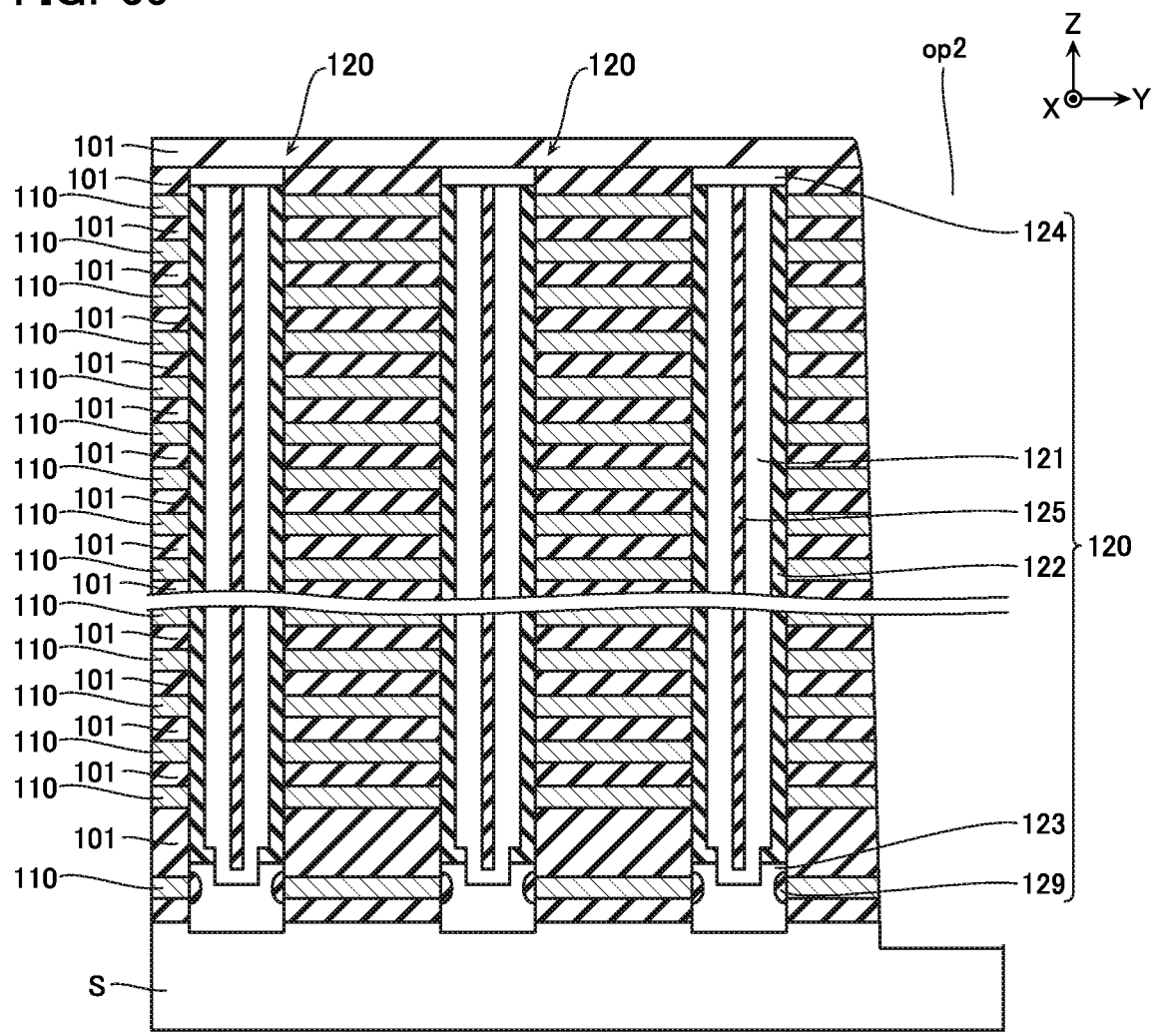
FIG. 35 is a schematic cross-sectional view of the manufacturing method.

Then, as illustrated in FIG. 35, a gate insulating film 129 and a conductive layer 110 are formed. The gate insulating film 129 is formed, for example, by an oxidation treatment method or the like. The conductive layer 110 is formed, for example, by the CVD method or the like.

Thereafter, an insulating portion ST of silicon oxide and the like is formed in the opening op2, and contacts, wirings, and the like are formed thereby to form the configurations described with reference to FIGS. 8 to 11.

[Effects]

As described above, the step illustrated in FIG. 34 forms the hollow structure including the plurality of insulating layers 101 and the structures 120A, 140A, and 150A by removing the sacrificial layers 110A. The structures 140A and 150A in this state play a role of supporting end portions and the like in the X direction of the insulating layers 101.

Here, in the present embodiment, as described with reference to FIG. 3A and the like, the structures 150 are electrically connected to the wirings 160 and the structures 150 are also used as memory. Thus, a highly integrated semiconductor memory device can be achieved.

As used herein, the outer peripheral surface of the memory structure 120 is covered with all the conductive layers 110 laminated in the Z direction. Therefore, by applying a voltage to the conductive layers 110, a channel of electrons can be formed in the semiconductor film 121 (FIG. 8) inside the memory structure 120 and the memory cells MCa can be connected to the bit line BLa and the source line SL.

Meanwhile, the outer peripheral surface of the structure 150 is covered only with some of the plurality of conductive layers 110, a portion near the upper end of the structure 150 may not be covered with any of the conductive layers 110. In such a case, even if a voltage is applied to the conductive layers 110, a channel of electrons cannot be formed near the upper end of the semiconductor film 151 inside the structure 150, and thus it may be difficult to connect the memory cells MCb to the bit line BLb.

Accordingly, in the present embodiment, as described with reference to FIG. 11, the semiconductor film 155 is provided in the structure 150. According to such a configuration, even if a channel of electrons cannot be formed near the upper end of the semiconductor film 151, the memory cells MCb can be connected to the bit line BLb.

Here, the structure 150 has a configuration similar to that of the memory structure 120, but has a configuration different from that of the memory structure 120. Therefore, there may be a difference in electrical characteristics and the like between a memory cell MCa corresponding to the memory structure 120 and a memory cell MCb corresponding to the structure 150. In such a case, it may be difficult to perform the same control as the memory cell MCa with respect to the memory cell MCb, for example, to record multi-valued data in the memory cell MCb.

Accordingly, in the present embodiment, the memory cell MCb corresponding to the structure 150 is not handled similarly to the memory cell MCa, but the memory cell MCb is utilized as a buffer memory. This configuration can reduce the area of a buffer memory provided in the peripheral circuit PC and thereby can achieve a highly integrated semiconductor memory device.

Further, in the present embodiment, the outer diameter of the structure 150 is greater than the outer diameter of the memory structure 120. In such an embodiment, an electric field applied to the semiconductor film 151 in the structure 150 tends to be less than the electric field applied to the semiconductor film 121 in the memory structure 120. Therefore, it is considered that for example, in reading operation, writing operation, and the like, to and from the memory cell MCa, even if a voltage is applied to the conductive layer 110, data in the memory cell MCb hardly fluctuates. Thus, the use of the memory cell MCb can provide a highly reliable buffer memory.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a first conductive layer and a second conductive layer arranged separated in a first direction crossing a surface of the substrate and extending in a second direction crossing the first direction, the first conductive layer being closer to the substrate than the second conductive layer, a length in the second direction of the first conductive layer being greater than a length of the second conductive layer;
   a first semiconductor film extending in the first direction and facing the first conductive layer and the second conductive layer;
   a second semiconductor film interposed between an end of the first conductive layer and an end of the second conductive layer in the second direction, extending in the first direction, and facing the first conductive layer;
   a first wiring farther from the substrate than the first semiconductor film and being electrically connected to the first semiconductor film; and
   a second wiring farther from the substrate than the second semiconductor film and being electrically connected to the second semiconductor film.

2. The semiconductor memory device according to claim 1, further comprising:
   a third wiring located closer to the substrate side than the first conductive layer and extending in the second direction, wherein
   the first semiconductor film and the second semiconductor film are electrically connected to the third wiring.

3. The semiconductor memory device according to claim 1, further comprising:
   a contact interposed between the other end of the first conductive layer and the other end of the second conductive layer in the second direction, extending in the first direction, and being connected to the first conductive layer at an end of the substrate side;
   a third semiconductor film interposed between the other end of the first conductive layer and the other end of the second conductive layer in the second direction, extending in the first direction, and facing the first conductive layer; and
   a fourth wiring farther from the substrate than the contact and being electrically connected to the contact.

4. The semiconductor memory device according to claim 3, wherein
   the first wiring and the second wiring are farther from the substrate than the fourth wiring.

5. The semiconductor memory device according to claim 3, further comprising:
   a third wiring located closer to the substrate side than the first conductive layer and extending in the second direction, wherein
   the first semiconductor film and the second semiconductor film are electrically connected to the third wiring; and
   the third semiconductor film is electrically isolated from the third wiring.

6. The semiconductor memory device according to claim 3, further comprising:
   a first gate insulating film interposed between the first conductive layer and the first semiconductor film;
   a second gate insulating film interposed between the first conductive layer and the second semiconductor film; and
   a third gate insulating film interposed between the first conductive layer and the third semiconductor film, wherein
   the third gate insulating film covers an end of the substrate side of the third semiconductor film.

7. The semiconductor memory device according to claim 3, further comprising:
   a first insulating film provided on a side surface in the second direction of the first semiconductor film;
   a fourth semiconductor film provided on a side surface in the second direction of the second semiconductor film; and a second insulating film provided on a side surface in the second direction of the third semiconductor film.

8. The semiconductor memory device according to claim 7, wherein
the first semiconductor film covers an end of the substrate side of the first insulating film;
the second semiconductor film covers an end of the substrate side of the fourth semiconductor film; and
the third semiconductor film covers an end of the substrate side of the second insulating film.

9. The semiconductor memory device according to claim 7, wherein
the fourth semiconductor film contains an impurity; and
a concentration of the impurity in the fourth semiconductor film is higher than a concentration of the impurity in the second semiconductor film.

10. The semiconductor memory device according to claim 9, wherein
the impurity is phosphorus (P).

11. The semiconductor memory device according to claim 1, wherein
in the second direction, a thickness of the second semiconductor film is greater than a thickness of the first semiconductor film.

12. The semiconductor memory device according to claim 1, wherein
the second semiconductor film contains an impurity; and
a concentration of the impurity in the second semiconductor film is higher than a concentration of the impurity in the first semiconductor film.

13. The semiconductor memory device according to claim 12, wherein
the impurity is phosphorus (P).

14. A semiconductor memory device comprising:
a substrate;
a first conductive layer and a second conductive layer arranged separated in a first direction crossing a surface of the substrate and extending in a second direction crossing the first direction, the first conductive layer being closer to the substrate than the second conductive layer, a length in the second direction of the first conductive layer being greater than a length of the second conductive layer;
a first semiconductor film extending in the first direction and facing the first conductive layer and the second conductive layer; and
a second semiconductor film interposed between an end of the first conductive layer and an end of the second conductive layer in the second direction, extending in the first direction, and facing the first conductive layer, wherein
in the second direction, a thickness of the second semiconductor film is greater than a thickness of the first semiconductor film.

15. The semiconductor memory device according to claim 14, wherein
the second semiconductor film contains an impurity; and
a concentration of the impurity in the second semiconductor film is higher than a concentration of the impurity in the first semiconductor film.

16. The semiconductor memory device according to claim 15, wherein
the impurity is phosphorus (P).

17. The semiconductor memory device according to claim 14, further comprising:
a third wiring located closer to the substrate side than the first conductive layer and extending in the second direction, wherein
the first semiconductor film and the second semiconductor film are electrically connected to the third wiring.

18. The semiconductor memory device according to claim 14, further comprising:
a third semiconductor film interposed between the other end of the first conductive layer and the other end of the second conductive layer in the second direction, extending in the first direction, and facing the first conductive layer, wherein
in the second direction, a thickness of the second semiconductor film is greater than a thickness of a third semiconductor film.

19. The semiconductor memory device according to claim 18, further comprising:
a first insulating film provided on a side surface in the second direction of the first semiconductor film; and
a second insulating film provided on a side surface in the second direction of the third semiconductor film, wherein
the first semiconductor film covers an end of the substrate side of the first insulating film; and
the third semiconductor film covers an end of the substrate side of the second insulating film.

20. A semiconductor memory device comprising:
a substrate;
a first conductive layer and a second conductive layer arranged separated in a first direction crossing a surface of the substrate and extending in a second direction crossing the first direction, the first conductive layer being closer to the substrate than the second conductive layer;
a first semiconductor film extending in the first direction and facing the first conductive layer; and
a second semiconductor film interposed between the first conductive layer and the first semiconductor film, wherein
the first semiconductor film contains an impurity; and
a concentration of the impurity in the first semiconductor film is higher than a concentration of the impurity in the second semiconductor film.

* * * * *